United States Patent [19]

Berrian et al.

[11] Patent Number: 4,980,562
[45] Date of Patent: Dec. 25, 1990

[54] METHOD AND APPARATUS FOR HIGH EFFICIENCY SCANNING IN AN ION IMPLANTER

[75] Inventors: Donald W. Berrian, Topsfield; Robert E. Kaim, Brookline; John W. Vanderpot, Rockport, all of Mass.

[73] Assignee: Varian Associates, Inc., Palo Alto, Calif.

[21] Appl. No.: 432,470

[22] Filed: Nov. 7, 1989

Related U.S. Application Data

[63] Continuation-in-part of Ser. No. 138,925, filed as PCT US87/00804 on Apr. 8, 1987, published as WO87/06391 on Oct. 22, 1987, Pat. No. 4,922,106, and a continuation-in-part of Ser. No. 25,860, Mar. 16, 1987, abandoned, said Ser. No. 138,925, is a continuation-in-part of Ser. No. 849,786, Apr. 9, 1986, abandoned.

[51] Int. Cl.[5] ................................. H01J 37/304
[52] U.S. Cl. ........................ 250/492.2; 250/397; 250/398
[58] Field of Search ............ 250/492.21, 492.2, 492.3, 250/398, 397

[56] References Cited

U.S. PATENT DOCUMENTS

| | | | |
|---|---|---|---|
| 2,777,958 | 1/1957 | LePoole | 250/49.5 |
| 3,122,631 | 2/1964 | Geerk, Jr., et al. | 250/41.9 |
| 3,569,757 | 3/1971 | Brewer et al. | 250/398 |
| 3,689,766 | 9/1972 | Freeman | 250/49.5 T |
| 3,778,626 | 12/1973 | Robertson | 250/492.21 |
| 3,816,748 | 6/1974 | Harrison | 250/296 |
| 4,017,403 | 4/1977 | Freeman | 250/492 A |
| 4,021,675 | 5/1977 | Shifrin | 250/492 A |
| 4,066,895 | 1/1978 | Iwanaga | 250/296 |
| 4,117,339 | 9/1978 | Wolfe | 250/492 A |
| 4,140,913 | 2/1979 | Anger et al. | 250/492 A |
| 4,260,893 | 4/1981 | Bakker et al. | 250/397 |
| 4,260,897 | 4/1981 | Bakker et al. | 250/492 A |
| 4,276,477 | 6/1981 | Enge | 250/398 |
| 4,283,631 | 8/1981 | Turner | 250/492 B |
| 4,421,988 | 12/1983 | Robertson et al. | 250/492.2 |
| 4,433,247 | 2/1984 | Turner | 250/492.2 |
| 4,447,773 | 5/1984 | Aston | 328/233 |
| 4,476,393 | 10/1984 | Taya et al. | 250/492.2 |
| 4,494,005 | 1/1985 | Shibata et al. | 250/492.21 |
| 4,564,763 | 1/1986 | Bruel et al. | 250/396 |
| 4,587,433 | 5/1986 | Farley | 250/492.2 |
| 4,633,138 | 12/1986 | Tokiguchi et al. | 315/111.81 |
| 4,661,712 | 4/1987 | Mobley | 250/492.2 |

FOREIGN PATENT DOCUMENTS 172103 12/1969 Netherlands.

OTHER PUBLICATIONS

PCT International Search Report, Ser. No. PCT/US87/00804.

J. H. Keller et al., IBM Technical Disclosed Bulletin, "Fine Ion Beam Optical System", vol. 19, No. 4, Sep., 1976.

Harald A. Enge Publication, "Effect of Extended Fringing Fields of Ion–Focusing Properties of Deflecting Magnets38, The Review of Scientific Instruments", vol. 35, No. 3, Mar., 1964.

W. N. Hammer IBM Technical Disclose Bulletin, "On–Line Ion Implantation Dose Uniformity Matter", vol. 18, No. 7, Dec., 1975.

D. Balderes, et al., IBM Technical Disclosure Bulletin, "High Speed Disk Scanner for Ion Implantation", vol. 19, No. 3, Aug. 1976.

*Primary Examiner*—Jack I. Berman
*Attorney, Agent, or Firm*—Stanley Z. Cole

[57] ABSTRACT

An ion beam scanning method and apparatus produce a parallel, scanned ion beam with a magnetic deflector having, in one instance, wedge-shaped pole pieces that develop a uniform magnetic field. A beam accelerator for the scanned beam has a slot-shaped passage which the scanned beam traverses. The beam scan and the beam traverse over a target object are controlled to attain a selected beam current and corresponding ion dose on a target object. Methods and apparatus are disclosed for increasing ion beam utilization efficiency without adversely effecting dose accuracy.

18 Claims, 15 Drawing Sheets

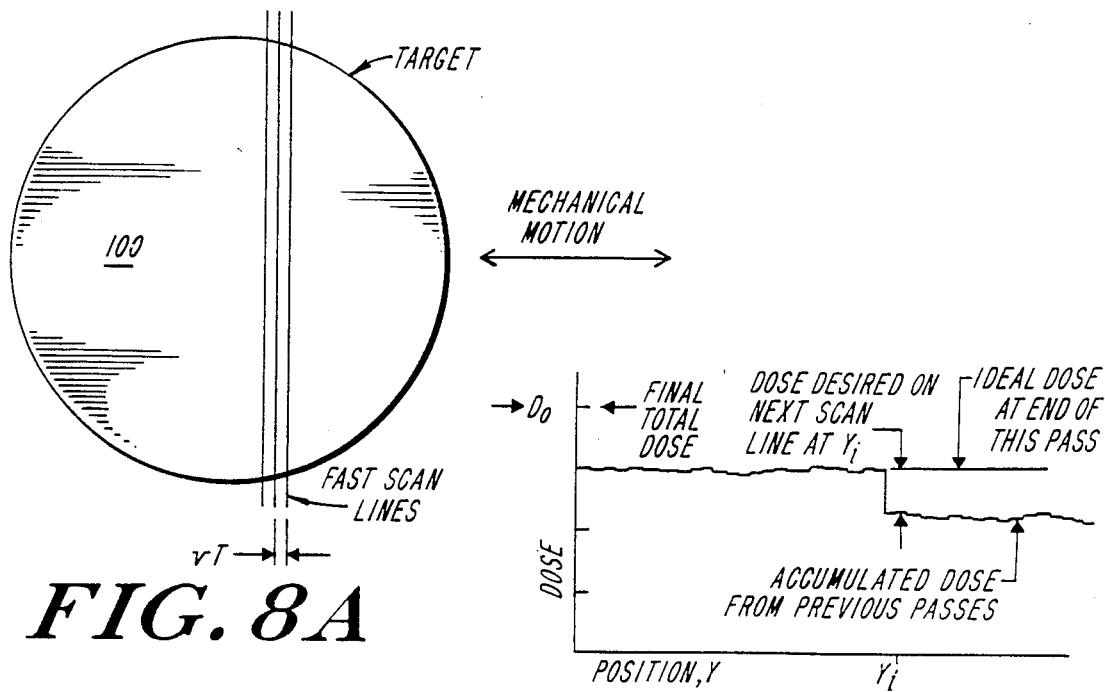
FIG. 8A
FIG. 8B
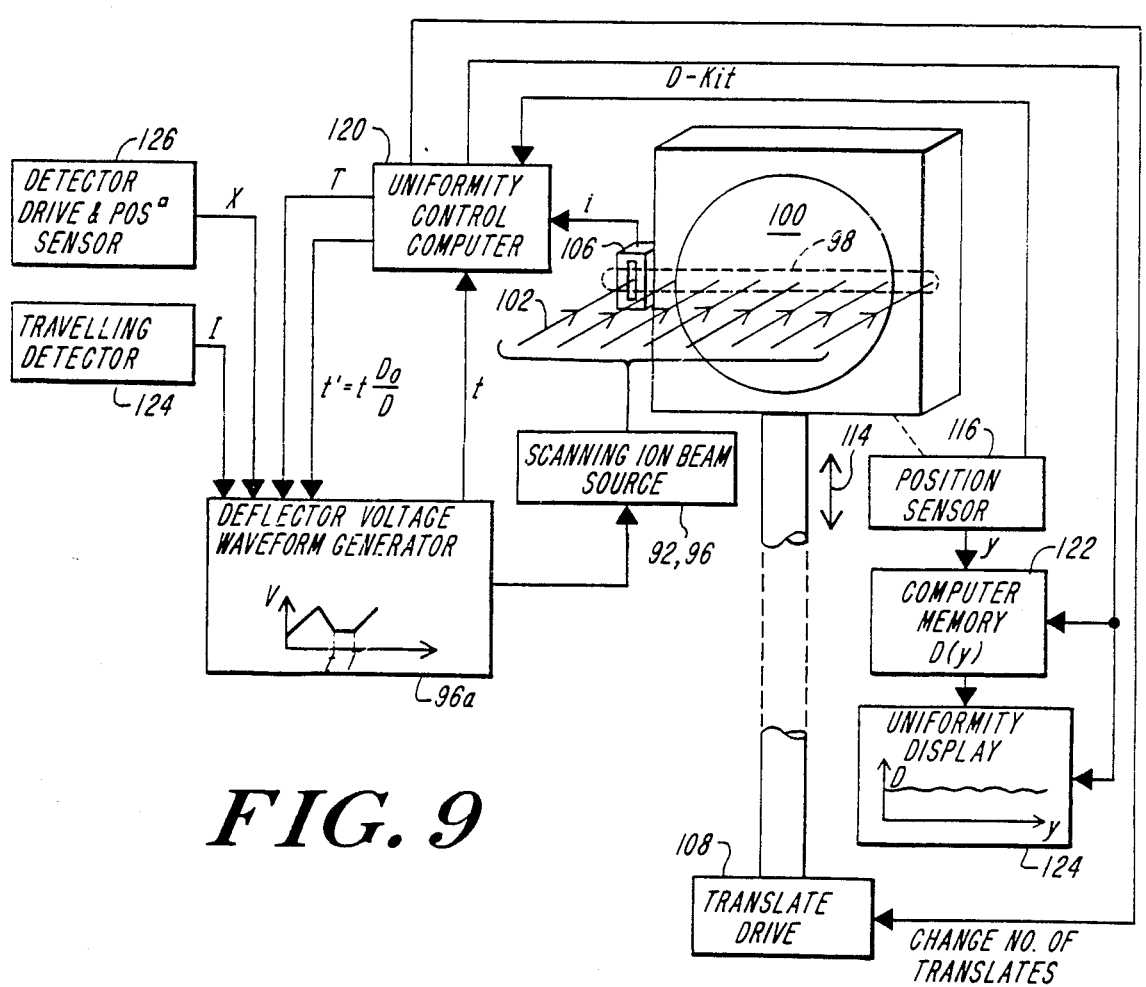
FIG. 9

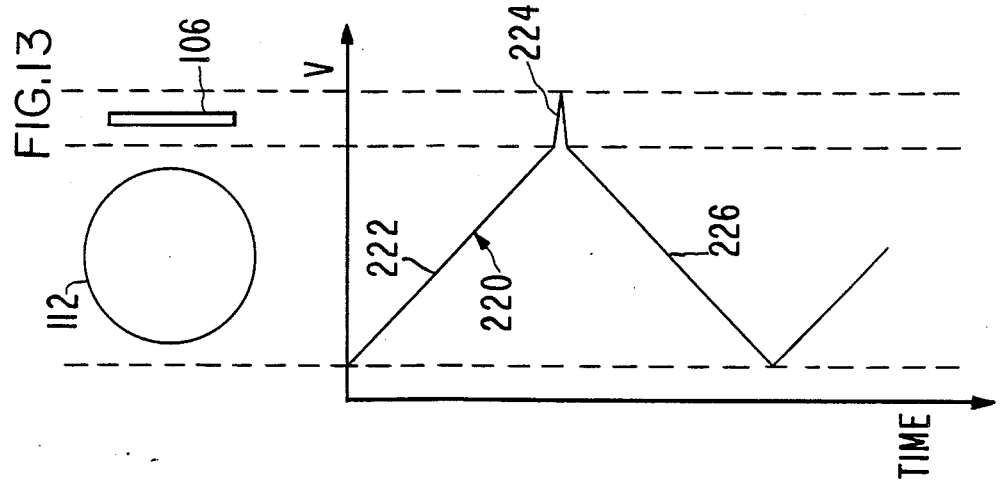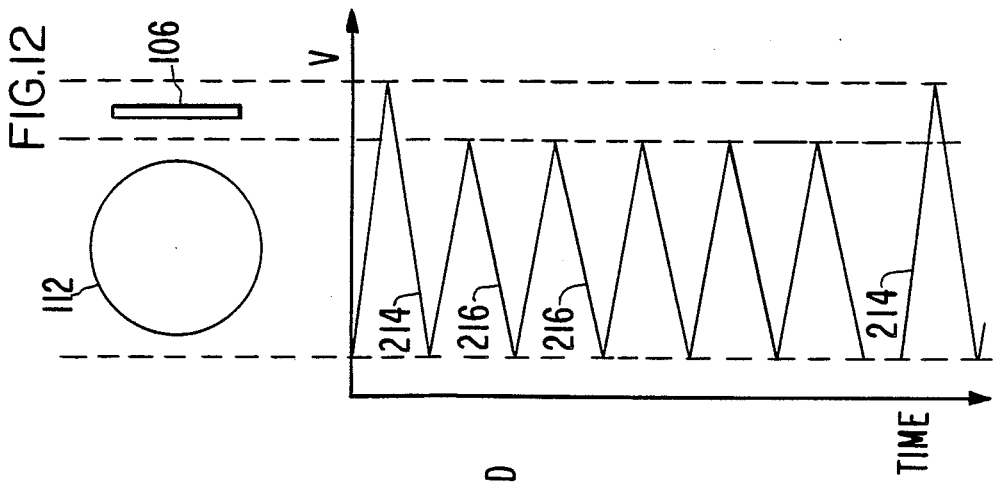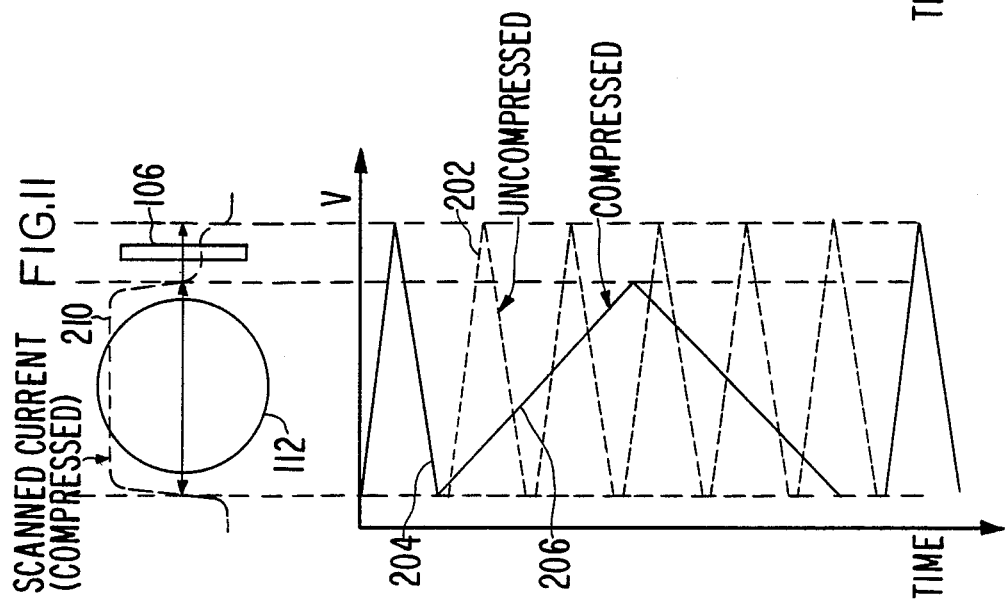

METHOD AND APPARATUS FOR HIGH EFFICIENCY SCANNING IN AN ION IMPLANTER

CROSS REFERENCE TO RELATED APPLICATIONS

This application is a continuation in part of U.S. application Ser. No. 138,925, filed Nov. 6, 1987, for "Ion Beam Scanning Method and Apparatus" (filed as International Application No. PCT/US87/00804, filed Apr. 8, 1987, published as WO87/06391 on Oct. 22), now U.S. Pat. No. 4,922,106, which is a continuation-in part of U.S. application Ser. No. 849,786, filed Apr. 9, 1986, for "Ion Beam Fast Parallel Scanning", now abandoned, and is a continuation-in-part of U.S. application Ser. No. 07/025,860, filed Mar. 16, 1987 for "Dose Uniformity Control For An Ion Implanter", now abandoned.

FIELD OF THE INVENTION

This invention relates in general to a method and apparatus for ion beam scanning, and more particularly concerns novel apparatus and techniques for high efficiency ion beam scanning wherein overscan of a target workpiece is minimized, while high dose accuracy is maintained.

BACKGROUND OF THE INVENTION

One prior art ion implanter uses two magnetic deflectors to produce a parallel scanning beam in one dimension. See, for example, U.S. Pat. No. 4,276,477. A disadvantage of this approach is that scan rates are low, typically of the order of only one Hertz. Furthermore, this prior art machine scans after acceleration of the ion beam, thereby requiring relatively large deflector fields. There is a problem in uniformly spreading the beam with such an ion beam implanter, that is in providing a spatially uniform dosage over a semiconductor wafer or other target object or workpiece.

The prior art also includes medium current ion implanters that use two dimensional scanning of an ion beam with electrostatic deflectors. However, such systems do not produce a parallel scanning beam, produce scanning after acceleration, and produce a beam whose intensity is subject to uncontrolled fluctuation.

Further, it is known in the manufacture of integrated circuits, with ion beam implantation of a semiconductor wafer, that accurate and precise ion dosage of the semiconductor are important for proper IC performance. Faulty ion implantation typically is not detected until too late to correct. It thereby renders the wafer, or at least parts of it, worthless even after costly processing.

One of the primary objectives in commercial semiconductor processing is to achieve a high throughput in terms of wafers processed per unit time. Factors which affect throughput in ion implanters include implant time, time to exchange wafers and downtime due to malfunctions. The implant time to achieve a given ion dose can be reduced by increasing the ion beam current. However, ion beam current is limited by heat which results from the energetic ions. Inefficiency in scanning arises from the fact that the ion beam is directed at the target semiconductor wafer during only a portion of the implant time. During other portions of the implant time, the ion beam may be directed at an ion beam current detector or a beam stop. Furthermore, in mechanical scan systems, scanning of the ion beam over the target wafer is usually prevented when the mechanical drive system is accelerating or decelerating in order to avoid dose variations resulting from velocity variations. In general, the ion beam may be directed at the target wafer only 30%–60% of the total implant time, thereby requiring additional time to achieve a given dose and adversely impacting throughput.

U.S. Pat. No. 4,633,138 issued Dec. 30, 1986 to Tokiguchi et al discloses an ion implanter wherein the width of a beam scan is controlled to approximate the shape of the wafer in response to a width sensor. The wafer speed is controlled to compensate for dose variations which result from different sweep widths. U.S. Pat. No. 4,260,897 issued Apr. 7, 1981 to Bakker et al discloses a technique for ion implantation wherein the beam sweep is controlled to match the shape of the target. Curved sensors on each side of the target detect the ion beam and initiate reversal of the sweep. U.S. Pat. No. 4,421,988 issued Dec. 20, 1983 to Robertson et al discloses a technique for ion beam scanning wherein the scan width is matched to the width of the target wafer by means of a predetermined sequence of scan times.

Accordingly, it is a general object of this invention to provide improved methods and apparatus for ion implantation.

Another object of the invention is to provide an ion beam implanting method and apparatus for attaining relatively precise and accurate ion dosage of semiconductor wafers, with relatively high throughput.

It is a further object of the present invention to provide methods and apparatus for ion implantation with high efficiency beam scanning.

It is a further object of the present invention to provide methods and apparatus for ion implantation wherein a beam detector is used to measure ion beam intensity without adversely affecting ion beam scanning efficiency.

It is yet another object of the present invention to provide methods and apparatus for ion implantation wherein implantation occurs during mechanical acceleration and deceleration of the workpiece so as to provide high efficiency ion beam scanning.

SUMMARY OF THE INVENTION

According to the present invention, these and other objects and advantages are achieved in methods and apparatus for ion implantation. According to one aspect of the invention, ion implantation apparatus comprises means for generating an ion beam, first scanning means for scanning the ion beam relative to a workpiece in a first direction, second scanning means for scanning the ion beam relative to the workpiece in a second direction so that the ion beam is distributed over the workpiece by the first and second scanning means, and detection means located adjacent to the workpiece for detecting the ion beam and providing a signal representative of the intensity of the ion beam, the first scanning means including means for scanning the ion beam across the workpiece and the detection means during a first scan interval and means for scanning the ion beam across an area not substantially greater in dimension than the maximum dimension of the workpiece during a second scan interval.

In a preferred embodiment of the invention, the first and second directions are mutually perpendicular. The first scanning means deflects the ion beam in the first direction in response to a generally ramp-shaped scan signal and the second scanning means provides mechanical translation of the workpiece in the second direction.

According to one preferred embodiment, the first scanning means includes means for generating a scan signal including a first scan signal during the first scan interval and a second scan signal during the second scan interval. The second scan interval, during which the ion beam is scanned only over the workpiece, is preferably longer than the first scan interval. The second scan signal preferably utilizes a slower scan rate than the first scan signal. Alternatively, the second scan signal can have a scan rate that is about the same as the scan rate of the first scan signal. In this case, the workpiece is preferably scanned multiple times during the second scan interval.

In one preferred embodiment, the means for generating a scan signal includes means for generating a single fast scan across the workpiece and the detection means during the first scan interval and a single slow scan across the workpiece during the second scan interval. During the second scan interval, the ion beam is scanned beyond the workpiece edge by a predetermined fraction of the cross sectional dimension of the ion beam, typically on the order of one-half the ion beam diameter. Since the detection means is scanned only during the first scan interval, the ion beam is applied to the workpiece for a greater fraction of the implant time, and beam utilization efficiency is increased.

According to another aspect of the invention, there is provided ion implantation apparatus comprising means for generating an ion beam, first scanning means for scanning the ion beam relative to the workpiece in a first direction, second scanning means for scanning the ion beam relative to the workpiece in a second direction so that the ion beam is distributed over the workpiece by the first and second scanning means, means for monitoring the position of the workpiece relative to the ion beam along the second direction, and means responsive to the monitoring means for generating one or more scans in the first direction each time the workpiece moves relative to the ion beam in the second direction by a predetermined distance.

In a preferred embodiment, the second scanning means comprises means for mechanical translation of the workpiece relative to the ion beam in the second direction. The mechanical translation means causes the workpiece to undergo reciprocating movement relative to the ion beam. The invention permits the amplitude of the mechanical translation to be reduced, thereby improving beam utilization efficiency. Scanning proceeds during acceleration and deceleration at the end of each mechanical translation without adversely affecting dose uniformity. As a result, the ion beam is more efficiently utilized over a greater portion of the mechanical scanning cycle. In a preferred embodiment, a scan signal in the first direction is triggered each time the workpiece is translated in the second direction by the predetermined distance. Thus, the scan lines are evenly distributed over the workpiece regardless of velocity variations in the second direction.

BRIEF DESCRIPTION OF THE DRAWINGS

For a fuller understanding of the nature and objects of the invention, reference is to be made to the following detailed description and the accompanying drawings, in which:

FIGS. 8A and 8B are diagrammatic representations of the relationship between ion beam dose and beam position relative to a target object illustrative of features of the invention;

FIG. 9 is a combined block pictorial representation of an ion implanting system in accordance with the invention;

FIG. 11 is a schematic diagram illustrating ion beam scan compression in accordance with the present invention;

FIG. 12 is a schematic diagram illustrating ion beam scan compression in accordance with another embodiment of the present invention;

FIG. 12A is a schematic diagram illustrating an alternate scan technique for increasing beam utilization efficiency;

DETAILED DESCRIPTION OF THE INVENTION

Figure 1:
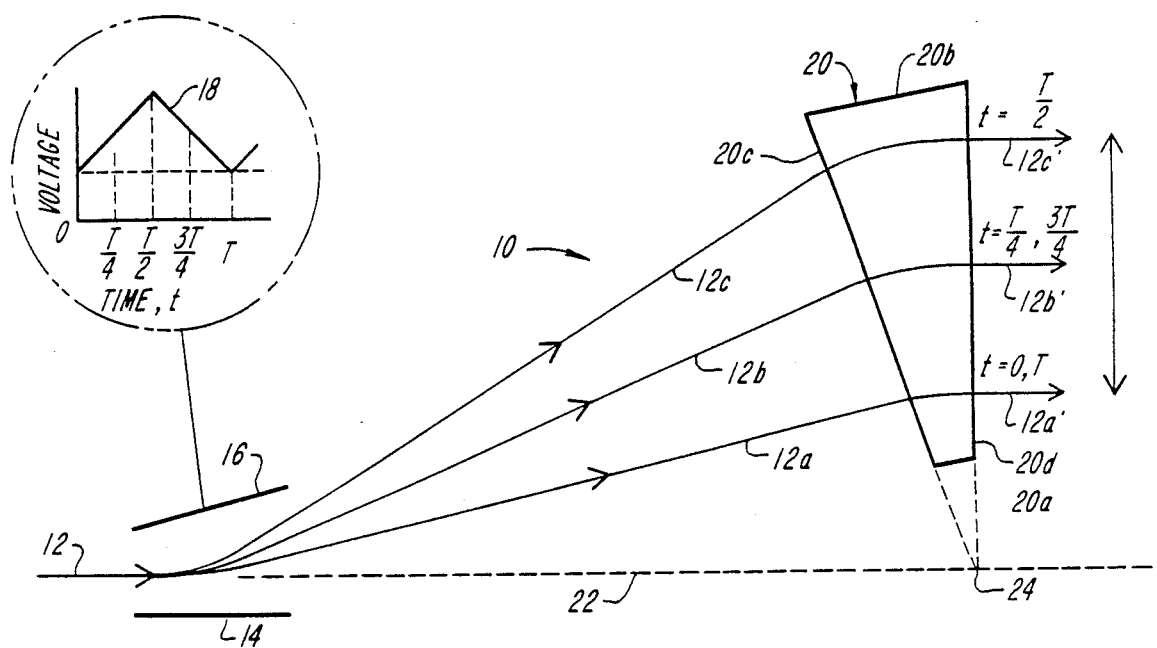
FIG. 1 is a diagrammatic representation of an ion beam scanning system according to the invention.

With reference to the drawing, and more particularly FIG. 1, there is shown a diagrammatic representation of elements of an ion beam scanning system 10 according to the invention and using both electrostatic and magnetic deflection of ion trajectories. The ion beam 12 from a source (not shown) first passes between electrostatic deflector plates 14 and 16 to which an oscillatory voltage waveform 18 is applied at a relatively high frequency, typically one thousand Hertz. This electrostatic deflection field cause the angle of emergence of the ion trajectories from the plates 14, 16 to vary in the manner shown in FIG. 1 for paths 12A, 12B and 12C corresponding to times 0, T/4 and T/2 respectively, where T is the period of the waveform 18. Trajectories 12A and 12B also correspond to times T and 3T/4 respectively, as indicated. The ions in the scanned beam subsequently enter a constant, uniform field magnet 20 of wedge shape whose profile is arranged so that ions emerge from it with all trajectories 12A', 12B' and 12C' parallel, irrespective of the initial angle of entry into the magnet 20. However, the position of ions emerging from the magnet is rapidly varying at the frequency of the oscillatory voltage waveform 18 applied to the deflector plates 14, 16.

FIG. 1 further shows that the deflector magnet 20, which typically is an electromagnet having a winding about sector-like pole pieces, one of which is shown, has a truncated triangular shape with a narrow truncated end 20a, a wider far end 20b and an entrance face 20c facing toward the deflector and opposite an exit face 20d. The initial axis 22 of the beam 12, in the absence of scanning deflection, is illustrated as coinciding in space with the intersection 24 of the spatial extensions of the truncated entrance face 20c and exit face 20d.

Figure 1A:
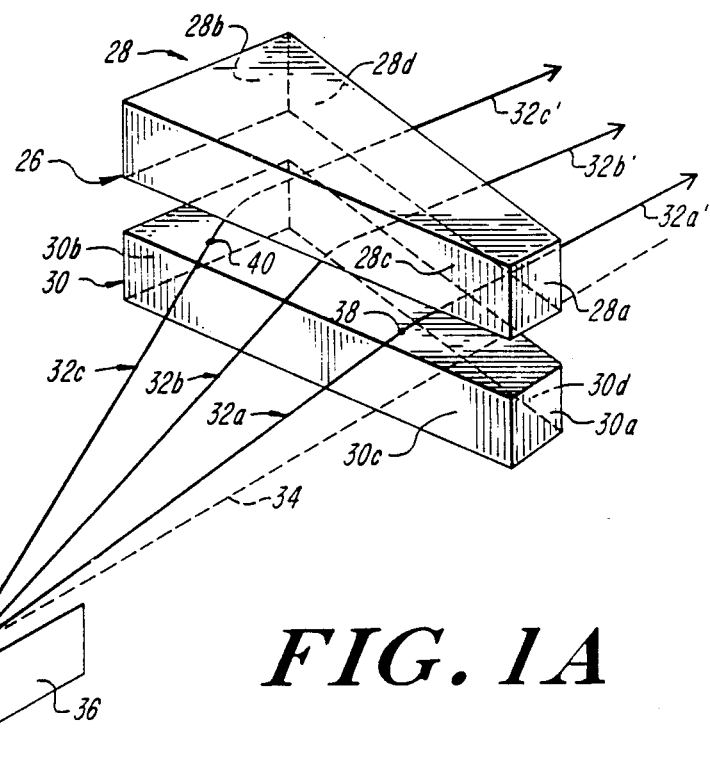
FIG. 1A shows a sector magnet according to the invention for beam deflection for the system of FIG. 1.

FIG. 1A shows further detail of a deflector magnet 26 which corresponds to the magnet 20 schematically illustrated in FIG. 1. The illustrated deflector magnet 26 has a pair of sector-like pole pieces 28 and 30 of identical truncated triangular shape and disposed in register one above the other with a gap therebetween of uniform width. Each magnet pole piece has a narrow truncated end 28a, 30a, and a wider far end 28b, 30b illustrated as extending parallel to the truncated end. Further, each pole piece has an entrance face 28c, 30c extending on one side from between the truncated and far ends and facing toward the ion source and obliquely opposite an exit face 28d, 30d.

FIG. 1A further illustrates the magnetic deflector 26 oriented relative to an ion beam source such that the initial axis 34 of the undeflected beam 32 passes through the gap proximal to the truncated pole piece ends 28a, 30a. The deflection of the beam by the deflector 36 forms the undeflected source beam into a scanning beam. The outer trajectories 32A and 32C of the scanning beam pass within the magnet 26 gap between first and second locations 38 and 40, which lie between the pole piece ends 28A, 30A and 28B, 30B as illustrated.

The deflection magnet configuration shown in FIG. 1A, with the initial beam axis 34 closer to the near edge trajectory 32A of the scanning beam than appears in FIG. 1—where the initial axis 22 passes outward of the pole pieces and beyond the truncated end 20A in the direction toward the facet intersection 24—is deemed advantageous for physical compactness and for low deflection voltage, e.g., DC bias, to shift the beam from the initial axis 34 to the desired scan trajectory.

Further, the magnet configurations of FIGS. 1 and IA, when fabricated with a uniform gap width as illustrated, provides highly uniform magnetic field along the gap between the truncated ends 28a, 30a and then for ends 28b, 30b. This is in contrast, in particular, to a sector magnet in which the pole pieces are not truncated as illustrated but extend essentially to a point or similar narrow width between the entrance and exit facets, which introduces field nonuniformities at the narrower end of the magnet.

Figure 2:
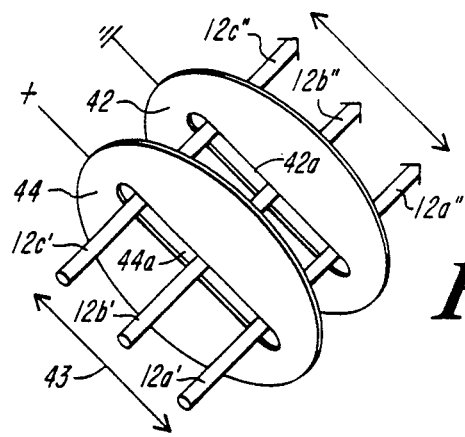
FIG. 2 is a pictorial representation of slotted acceleration electrodes that facilitate acceleration of an ion beam after scanning.

Referring to FIG. 2, there is shown slotted acceleration electrodes 42, 44 according to the invention for introducing post-deflection acceleration to the low-energy scanned ion beam emerging from the deflector magnet 20 of FIG. 1. Positive slotted electrode 44 and grounded electrode 42 establish an axial acceleration field therebetween that sharply increases the energy in the scanned ion beam over trajectories 12A", 12B" and 12C". Acceleration of the ions after traversing the scanning fields is advantageous because the intensity of the electrostatic and magnetic deflection fields operating on low energy ions is significantly less than would be required for deflecting after acceleration.

With further reference to FIG. 2, each electrode 42, 44 is apertured with a slot 42a, 44a, respectively, having uniform width as measured transverse to the scan direction 43 of the beam 12 of FIG. 1. The length of each slot, as measured along the beam scan direction 43 is the same for the two illustrated electrodes 42, 44, for use with a parallel scanning beam.

In contrast to an ion beam accelerator of conventional design with a circular aperture through each electrode, the slotted electrode aperture which the present invention provides subjects the scanning ion beam to a fringe electrostatic focusing field that has the same value along the entire width of the scanning beam, i.e. along the slot length, and has the same focusing direction, i.e. perpendicular to the scan direction 43 and in the plane of each illustrated electrode. This attainment of uniform fringe field in the accelerator for every trajectory of a scanning beam is advantageous in an instrument to attain precise and accurate beam trajectories. Moreover, the provision of slotted beam passages in the accelerator electrodes enables the accelerator to be constructed far more compactly than an equivalent accelerator having circular electrode passages.

In one illustrative embodiment of an ion beam scanning instrument as illustrated in FIGS. 1 and 2, the ion beam has an energy in the order of 35 kilovolts in the deflector portion, as illustrated in FIG. 1, and is accelerated to a 200 kilovolt level by the accelerator of FIG. 2. The ion beam has a height in the order of one-quarter inch in the accelerator of FIG. 2, and a scanning width in the order of ten inches. The accelerator electrode slot for this embodiment has a slot width of 1.6 inch and a slot length of 14 inches. Thus the slot in each accelerator electrode has a length-to-width, aspect ratio in the order of 10, namely 8.75 in this illustrative embodiment. More generally, the invention is typically practised with an accelerator electrode slot length-to-width ratio in excess of three.

Figure 2A:
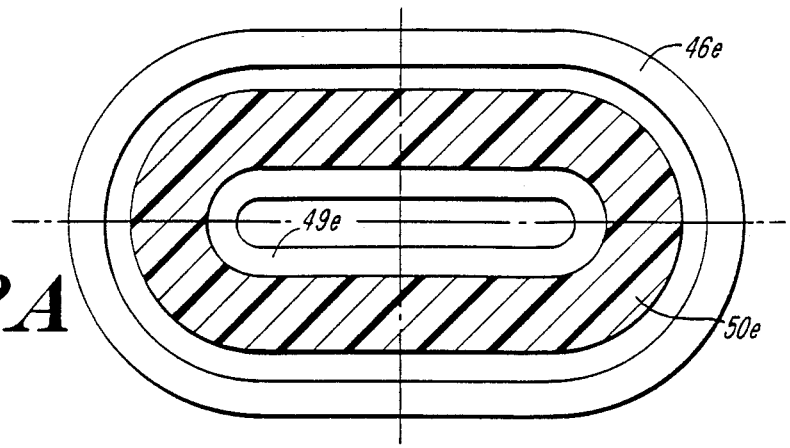
FIGS. 2A and 2B show one construction of an acceleration column for a scanning beam according to the invention.
Figure 2B:
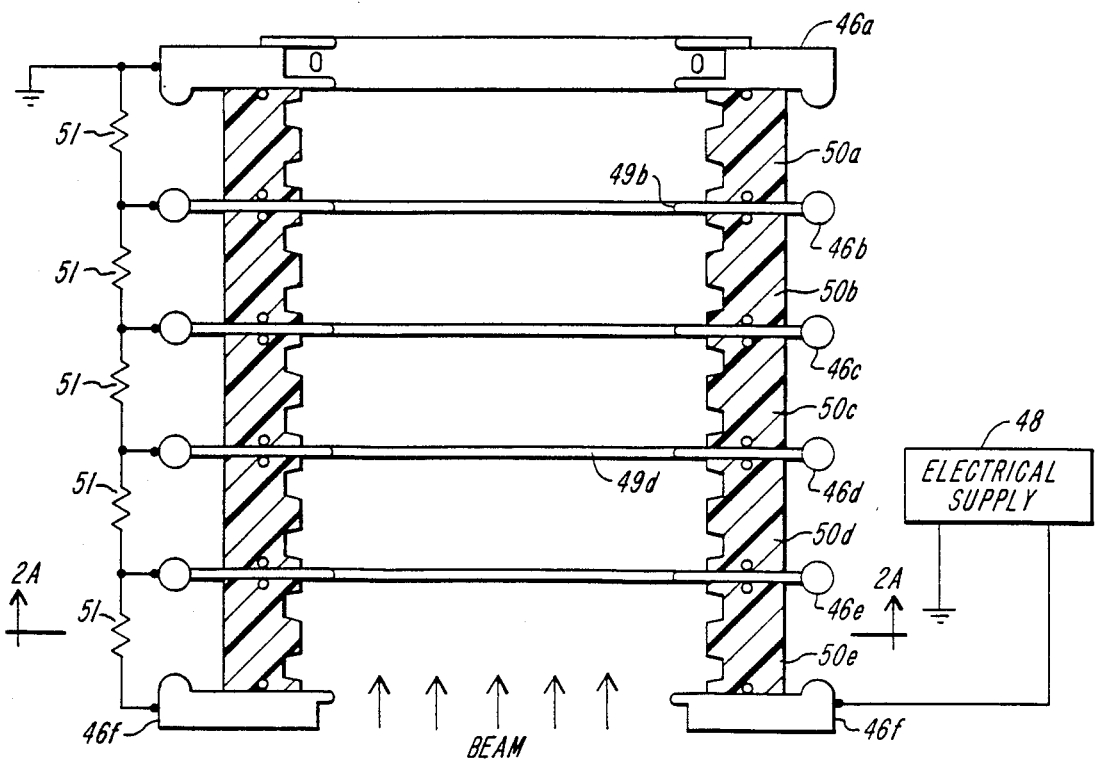

FIGS. 2A and 2B further illustrate a preferred construction of an accelerator for a parallel scanning ion beam. As is conventional, the accelerator has a series of electrodes 46a, 46b, 46c, 46d, 46e and 46f arranged axially aligned in register and with one another, and with identical slotted apertures 49a, 49b, 49c, 49d, 49e and 49f through which the parallel beam passes. An external accelerator voltage supply 48 is connected with the entrance electrode 46f to maintain it at a high positive potential and resistors 51 connected between the electrodes as shown ensure that the potential on successive electrodes falls in proportion to the resistor values as one proceeds from the entrance electrode 46f to the exit electrode 46a. A succession of collar-like housings of electrically insulating material 50a, 50b, 50c, 50d and 50e are assembled in axial succession with the electrodes sandwiched therebetween as illustrated to form the acceleration column with openings only at the axial ends for the entrance and exit respectively of the scanning beam. The accelerator accordingly when assembled with other elements of the implant instrument can be evacuated by an external vacuum system to establish and maintain a desired vacuum therein, as is conventional.

Figure 3:
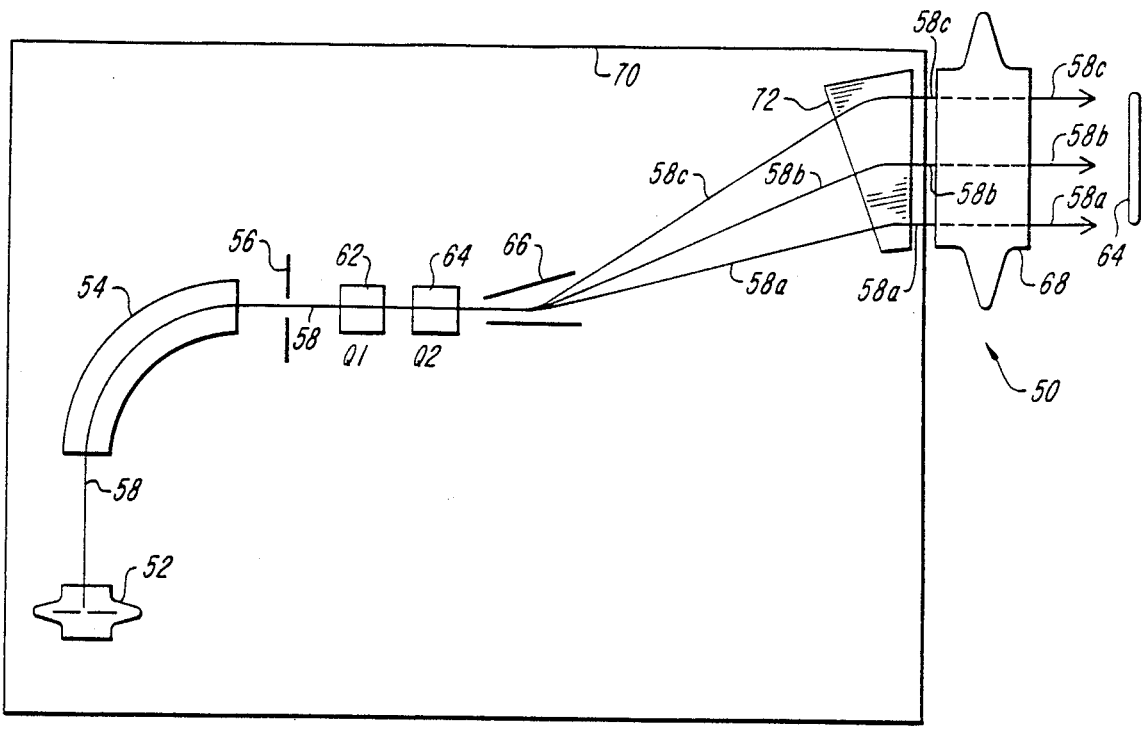
FIG. 3 is a diagrammatic representation of an ion beam scanning system according to the invention.

Referring to FIG. 3, there is shown a diagrammatic representation of a composite ion beam optical system 50 according to the invention for producing ion beams with a number of advantageous properties. Mass resolution is greater than eighty. The system 50 has the ability to scan the beam in one dimension at rates in excess of 1000 Hertz. The scan amplitude and waveform are easily controlled. The physical layout is compact. The beam size and shape on the target may be controlled relatively easily.

Mass selection of ions from a suitable source 52 is achieved with an analyzing magnet 54 and an image slit 56. The analyzed beam 58a is focused with magnetic quadrupole lenses 62 and 64 which enable control of the size and shape of the scanned beam 58 on a target 64. The focused beam enters deflection plates 66 for scanning and next reverses a magnetic deflector 72, as described above with reference to FIGS. 1 and 1A, and thereafter passes through an acceleration column 68 containing slotted electrodes, as described with reference to FIGS. 2, 2A and 2B. A high voltage cage 70 surrounds the source 52, the analyzing magnet 54 and image slit 56, the focusing magnets 62 and 64, the deflection plates 66, and the magnet deflector 72. Further, as is conventional in equipment of this type, vacuum chambers and a vacuum pump system (not shown) maintain the entire path of the beam 58, from the source 52, to and including the target 64, at a selected high vacuum.

Figure 3A:
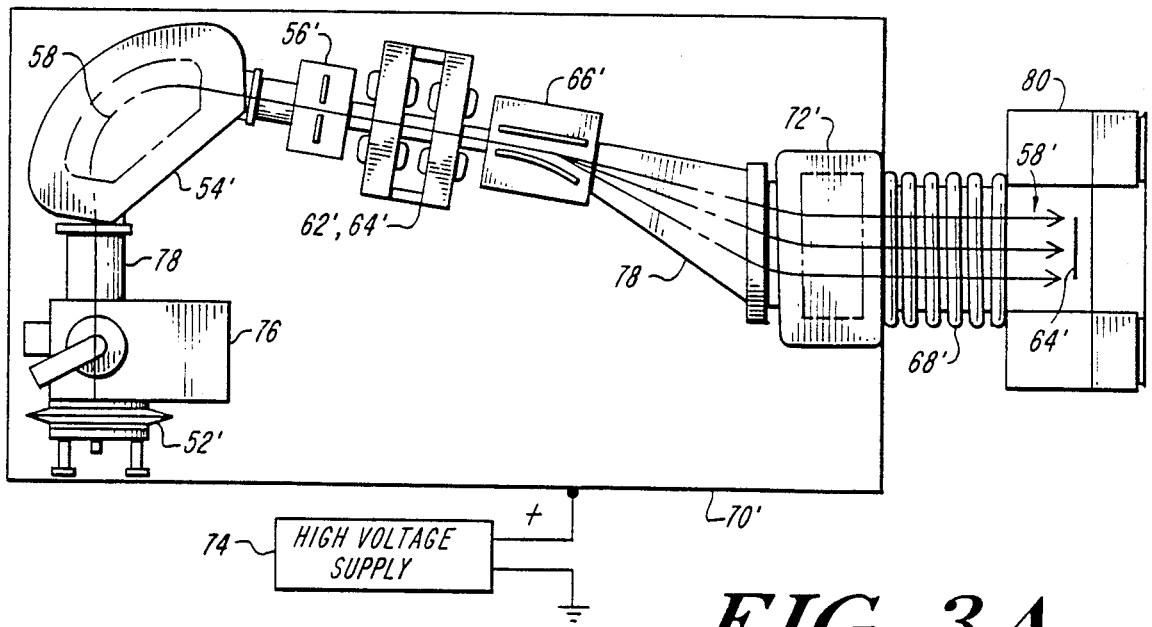
FIG. 3A shows another representation similar to FIG. 3 in accord with further features of the invention.

FIG. 3A shows another ion beam implanter system 50' similar to system 50 of FIG. 3 and having a source 52' of an ion beam 58'. From the source 52' the beam 58' passes through an analyzing magnet 54', a resolving slit 56', a magnetic quadrupole doublet focussing subsystem 62'-64', an electrostatic deflector 66', and a magnetic deflector 72', typically employing a dipole magnet structure. The deflector 72' can employ the structure of FIGS. 1 and 1A or can employ the structure disclosed in commonly assigned U.S. Pat. No. 4,745,281 the disclosure of which is incorporated herein. The foregoing elements of the system 50' are within a high voltage cage 70' that is at an electrostatic potential which the high voltage supply 74 maintains at up to several hundred kilovolts, typically, above ground. The system also has a vacuum pump 76 and a vacuum enclosure indicated at 78, which provides a vacuum tight chamber within which the beam 58 passes from the source 52' to a target 64' within a vacuum-tight end station 80.

With further reference to FIG. 3A, the illustrated system 50' includes an acceleration column 68' of the type described above with reference to FIGS. 2, 2A and 2B, and from there the scanning beam 58C passes into the end station 80, where a semiconductor wafer or other target 64' can be disposed for irradiation by the beam.

The illustrated analyzing magnet 54' imparts a change in the path of the ion beam 58, relative to the path of the beam as it exits from the source 52', of slightly greater than 90 degrees. Further, this bending of the path is in the same direction, e.g. clockwise in FIG. 3A, as the beam deflection which the scanner 66' imparts. The further deflection by the deflector 72', to cause the scanning beam to have parallel trajectories, is in the opposite direction, e.g. counterclockwise. With this arrangement, the scanning beam is located not at one side of the system 50 as is the case in the implementation of FIG. 3, but rather is located at the center of the system, as indicated at the right side of FIG. 3A.

This designation of the relative location of the scanning beam, as it exits from the implanter to a target in FIGS. 3 and 3A corresponds to practical implementations, and the configuration shown in FIG. 3A is deemed advantageous and preferable. One advantage of the arrangement and geometric relation of FIG. 3A is that the end station 80 in which the target 64 is located can be at the center of the high voltage enclosure 70', i.e., midway between the top and bottom of the top, plan view layout as appears in FIG. 3A, rather than at one extreme end as appears in FIG. 3. The system 50' in FIG. 3A achieves this geometrical compactness and symmetry in part by using an analyzing magnet 54' which imparts, as stated, a slightly greater than 90 degree change in the path of the ion beam. In one illustrative specific instance, the analyzing magnet 54 of FIG. 3 imparts a substantially 90 degree change to the beam path, whereas the magnet 54' in FIG. 3A imparts a 100 degree change. The additive angle of deflection by the scanning deflector 66' relative to the analyzing magnet 54', e.g., both being clockwise deflections, is a further element in attaining the physically compact and symmetrical configuration of the system 50' as appears in FIG. 3A. Moreover, the additive angle of deflection directly reduces the DC bias required on the scanning voltage of plates 66' of FIG. 3A relative to plates 66 of FIG. 3.

Figure 4:
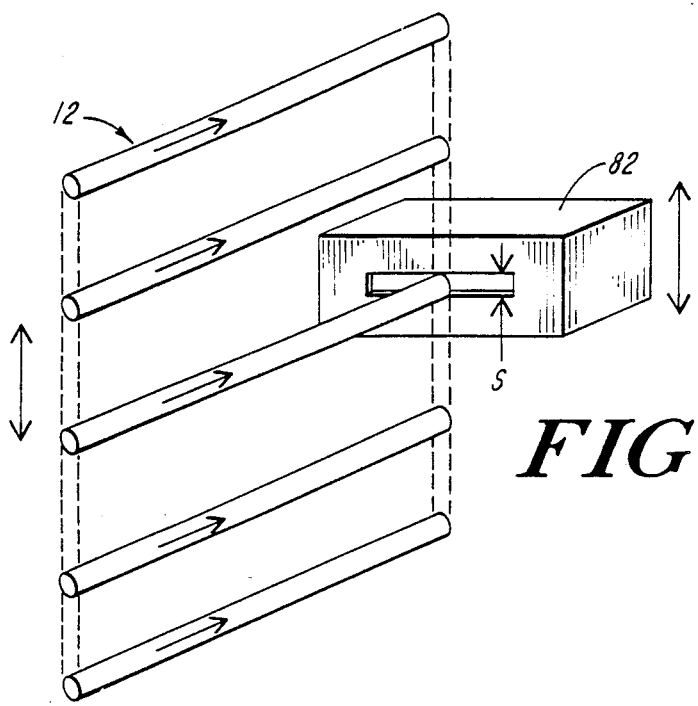
FIG. 4 is a diagrammatic representation of a slowly translating Faraday detector providing information useful in maintaining beam intensity uniform through the scanning length.

Referring to FIG. 4, there is shown a diagrammatic representation of a slowly translating Faraday detector for providing a signal useful in controlling beam intensity. A Faraday or other ion beam measuring device 82 is slowly translated through the scanned ion beam 12 as produced in FIG. 1 and following acceleration by a slot shaped acceleration column 68 as in FIG. 2. The Faraday detector 82 is slowly translated in the same direction as the beam scan, and the integrated beam current or dose is measured as a function of the position of the Faraday detector 82 to provide a signal representative of the ion beam intensity as a function of position. This signal may be used to adjust the waveform 18 of the oscillatory voltage (FIG. 1) on the electrostatic deflection plates 14–16 of FIG. 1 so that the integrated beam intensity is uniform throughout the scanning length.

Assume that the voltage waveform generates an ion beam scanning speed $S(x)$ at any point in the target plane, where $(x)$ is the scan direction. If the measured current at the point $(x)x$ is $i(x)$, and the desired current is $(i_o)$ (corresponding to some desired uniform dose $(d_o)$), then the required scanning speed is $$S'(x) = S(x) * i(x)/i_o. \qquad \text{(Eq. 1)}$$

The scanning speed is directly related to the gradient $(dV/dt)$ of the voltage waveform, so that by correcting $dV/dt$ point by point over the scanned length, the same uniform dose $(D_o)$ is maintained for all values of $(x)$.

The usefulness of this technique is a consequence of the need to produce uniform dose for semiconductor ion implantation over a wide range of ion species and energies The scan speed profile $S(x)$ required for a given set of operating parameters may vary due to changes in beam diameter, or non-linearities in magnetic and electrostatic deflectors, in ways not readily predictable theoretically. The ability to measure and compensate for these variations rapidly as FIG. 4 illustrates is a significant advantage. Specific apparatus for implementing these techniques is known in the art and accordingly is not described in detail here.

Figure 5:
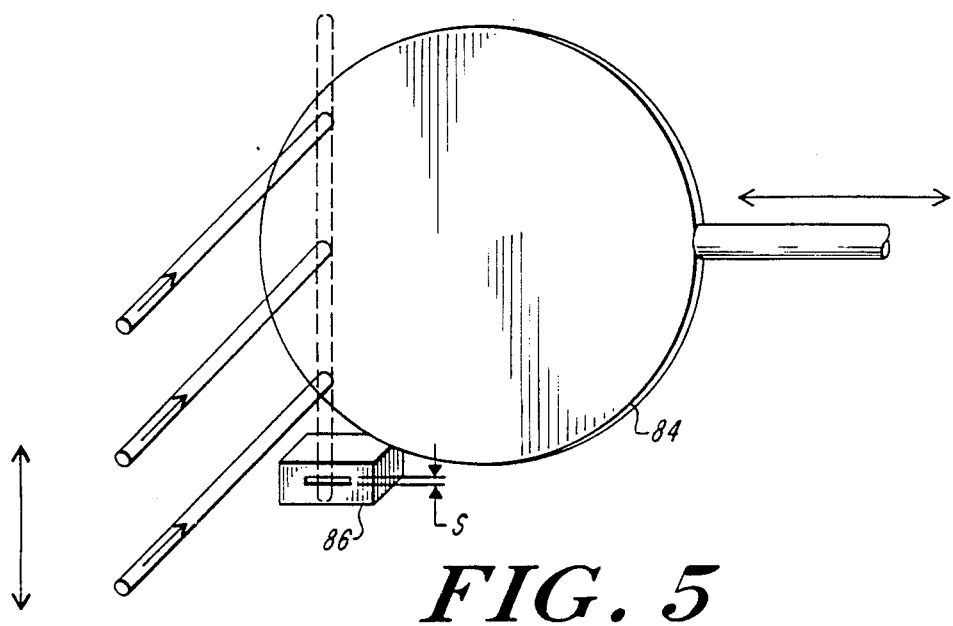
FIG. 5 is a diagrammatic representation of elements in a system using a one-dimensional fast-scanned beam in conjunction with a slow mechanical scanning mechanism for achieving substantially uniform irradiation of a two-dimensional target surface.

Referring to FIG. 5, there is shown a diagrammatic representation of the addition of a mechanical translator for slowly mechanically scanning a target in a direction transverse to the direction of fast scanning of the ion beam for providing uniform irradiation of a two dimensional target surface. A target 84 is mechanically translated with speed (v) in a direction orthogonal to the ion beam scanning direction. The beam is sampled at one end of the scanned region by a fixed Faraday detector 86 with an entrance slot of width (s). If a uniform dose $d_o$ per pass is required over the whole target surface, then the speed of the mechanical scan should be $$v(y) = i_F(y)/s \; d_o \qquad \text{(Eq. 2)}$$

where $i_F(y)$ is the measured average current, in particles per second, in the Faraday detector 86. The scan speed is continuously updated by an appropriate control mechanism thus ensuring uniform dose despite slow drifts in the magnitude of the beam current. The specific control mechanism for updating scan speed is also known in the art and not described in detail here.

Figure 6:
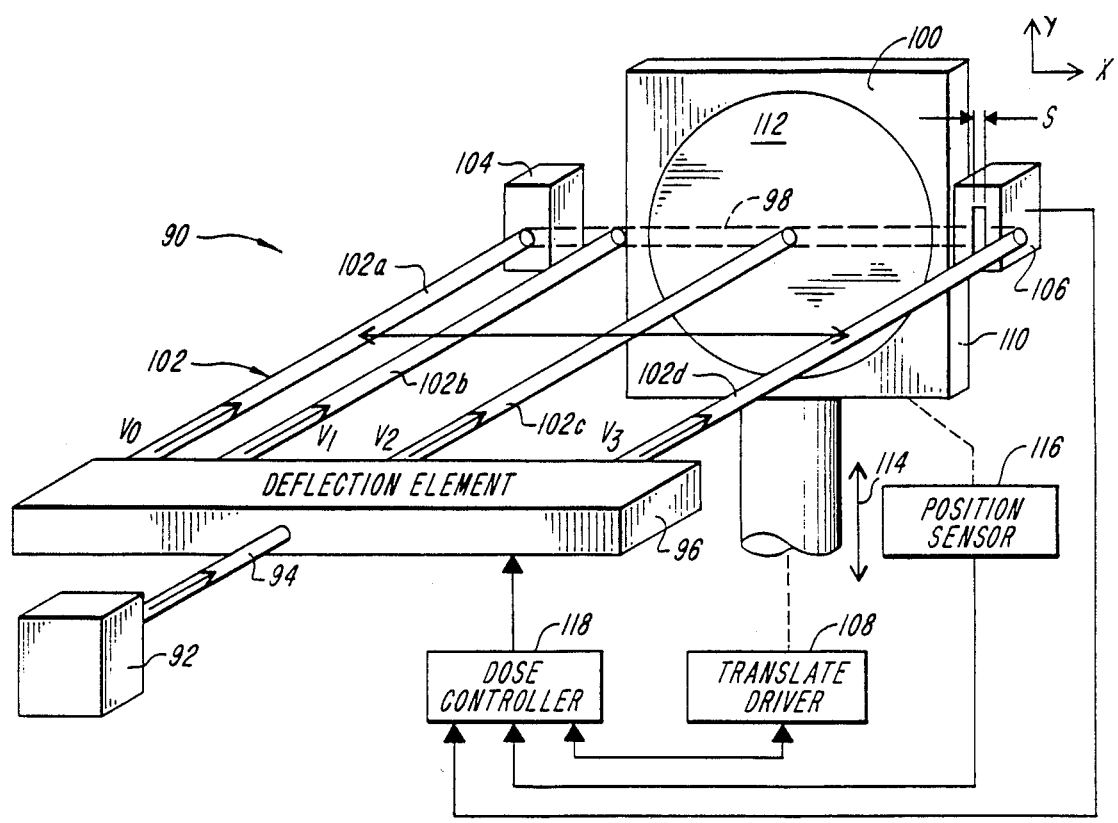
FIG. 6 is a diagrammatic block representation of scanning ion beam implanting apparatus embodying features of the invention.

The pictorial diagrammatic representation of FIG. 6 shows a scanning beam, ion implant system 90 which controls the exposure of a target object to the ion beam at least at selected times or positions during the implant processing—and preferably substantially continuously in both time and spatially—to attain a uniform or other selected dose profile throughout the target surface. The illustrated system 90 provides this function and result at least in part by compensating for ion beam current variations by varying the time that the beam is incident on the target.

In the illustrated system 90, an ion source 92 directs an ion beam 94 to a deflection element 96 that deflects the ion beam to traverse back and forth along a scanning path 98 which crosses a target surface 100. The deflection element, which preferably employs electrostatic scanning and magnetic deflection, produces a planar scanning beam 102 with parallel trajectories. The scanning trajectories illustratively range from one extreme, initial position 102a—that may correspond to a deflection potential of $V_0$ as diagramed and along which the beam intercepts a beam stop 104 at an end of the scanning path 98—to another extreme position 102d. The latter trajectory intersects and defines the other end of the scanning path 98 and is beyond the target surface 100 and beyond a Faraday current detector 106. The illustrated detector 106 is located adjacent the target surface 100, and has a slit of width (s) as measured along the scanning path 98.

Thus, there is a voltage $(V_0)$ (possibly zero volts) across the deflection plates of the deflection element 96 that produces a scanned beam trajectory 102a which is incident on the beam stop 104, and in which no beam ions strike the target surface 100. In response to deflection voltages between $(V_1)$ and $(V_3)$, the deflection element 96 produces the beam 102 with trajectories that progressively scan over the target surface 100 along the target path 98, and extend beyond the target surface to sweep across the aperture of the Faraday detector 106.

In response to each sweep of the ion beam 102, the detector 106 produces a current pulse which is characterized by a time integral proportional to the ion current density in that scan. This time integral of the sensed current is used as a feedback signal which is applied to a dose controller 118 to control the operation of the deflection element 96.

The system 90 of FIG. 6 is further illustrated as having a translation driver 108 coupled, as with a shaft, to a target transport 110 on which a target object 112 such as a semiconductor wafer can be mounted. The translation driver 108 is operable to move the target transport 110 in the direction transverse to the scanning path 98, i.e. in the direction indicated with arrow 114, from a position (not shown) where the target surface is entirely removed from the scanning path 98, e.g. is below it, to a further position where the target surface is entirely on the other side, e.g. above the scanning path 98. A position sensor 116 is coupled with the target transport 110, correspondingly of the target object 112 along the translation axis of arrow 114. The sensor produces a target position signal, as a function of time, which is applied to the dose controller 118 for further control of the ion implantation dosage on the target object. The illustrated dose controller 118 also is connected with the translation driver 108.

FIGS. 7A through 7F show graphical representations of various scanning voltage wave-forms, each as a function of time, that can be applied to electrostatic deflection plates, in the deflection element 96 of the FIG. 6 system 90, for deflecting the incident beam 94 to form the planar scanning beam 102. The frequency of each deflection waveform preferably is sufficiently high, e.g., 1000 Hertz, to scan the beam across the path 98 with a relatively rapid first scanning rate significantly faster than the second rate, at which the translation driver 108 mechanically translates the target transport 110. This latter, second scanning movement in the illustrated system 90 is perpendicular to the trajectories of the scanning beam 102, as FIG. 6 shows, and is orthogonal to the path 98 along which the ion beam scans.

Figure 7A:
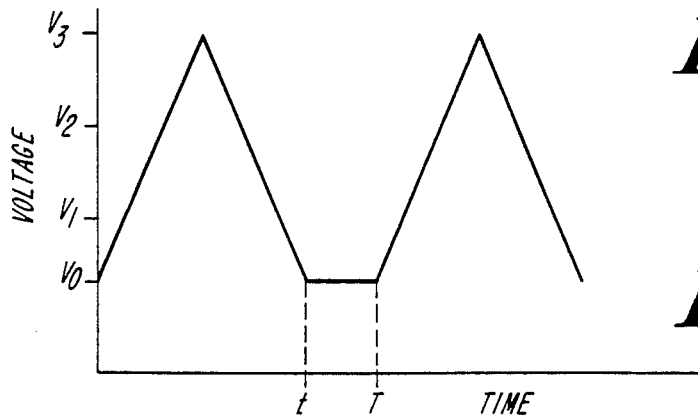
FIGS. 7A-7F illustrate representative scanning waveforms which may be applied to electrostatic deflection plates for producing a fast scan for practicing the invention.

The deflection waveform shown in FIG. 7A causes the scanning beam 102 to scan across the target surface 100 uniformly in one direction and then in the reverse direction in a time interval (t). The scanning beam then remains essentially stationary at trajectory 102a and is directed at the beam stop, until a further time (T). Thus, for the time interval between times (t) and (T), the deflection voltage remains at the $(V_0)$ value so that the scanning beam 102 is not incident on the target surface 100, and instead is incident on the beam stop 104. The linear ion density (h) delivered to the target surface 100 with this single back and forth scan can be represented by the equation $$h = kit \qquad \text{(Eq. 3)}$$

where
(i) is the beam current as measured by the Faraday current detector 106 in the course of a single scan along the path 98, and
(k) is a constant which depends on the geometry of the apparatus.

When the desired dose per scan is $(h_0)$, and the current responsive signal which the dose controller 118 receives from the then current detector 106 indicates that the beam current is such that a greater or lesser dosage (h) is being introduced, the dose controller responds to diminish if not completely compensate for the deviation from the desired dose. In particular, the controller changes, i.e. reduces or increases, the scanning deflection rate produced by the deflection element 96, so that the scanning time on the next scan of the beam is (t'), where $$t' = th_0/h \qquad \text{(Eq. 4)}$$

The system 90 of FIG. 6 thus alters the fast scanning time in this manner for every beam scan, or for each of a selected set of one or more scans, to compensate for changes in beam current, during the course of the slow scan of the beam across the target surface, i.e., during target translation in the direction of the arrow 114.

With further reference to FIGS. 6 and 7A, the time (T) for commencing each beam scan preferably is unchanged, in order to maintain a given increment of ion beam overlay on the target object during successive scans as the object translates with constant speed. Where the speed of mechanical motion of the target transport 110 along the mechanical translation direction is constant and equal to ($v_0$), the fast beam scan time correction set forth in Equation 4 can occur with a constant repeat time ($T_0$) which corresponds to a constant repeat distance of the target object 112 along the direction 114 equal to $$v_0 T_0 \qquad \text{(Eq. 5)}$$

The system 90 can also compensate for changes in the mechanical scanning velocity by establishing a scanning duration $$t' = t d_0 v / d v_o \qquad \text{(Eq. 6)}$$

where
(v) is the measured translate velocity of the target transport 110 in the direction of arrow 114, and
$v_0$ is the desired constant translate velocity.

Alternatively, the dose controller 118 can vary the repeat time (T) to compensate for changes in the translate rate (v). This can be achieved by initiating, i.e., triggering, the start of each scan of the ion beam each time the target transport 110 completes an incremental translate movement over a constant distance $v_0 T_0$. In the event the translate speed changes to a different value v, the dose controller 118 can automatically trigger the next beam scan to occur with a repeat time (T) such that $$vT = v_0 T_0 \qquad \text{(Eq. 7)}$$

Figure 7B:
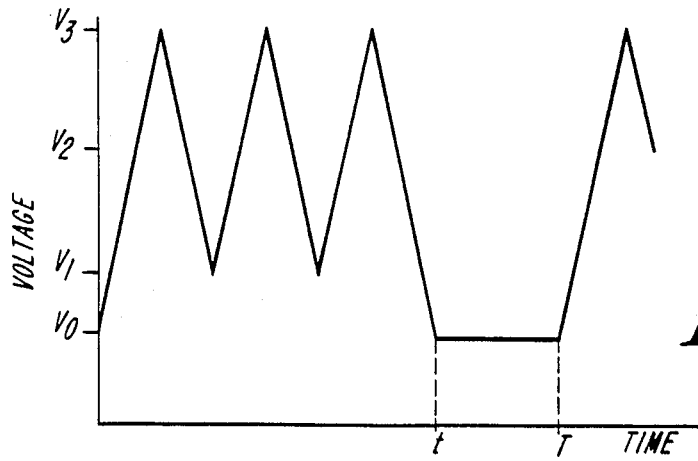
Figure 7C:
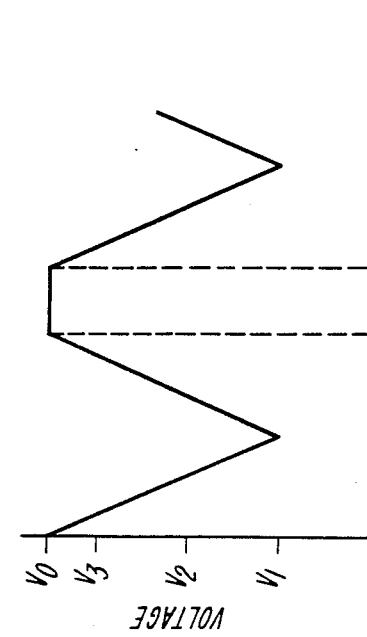
Figure 7E:
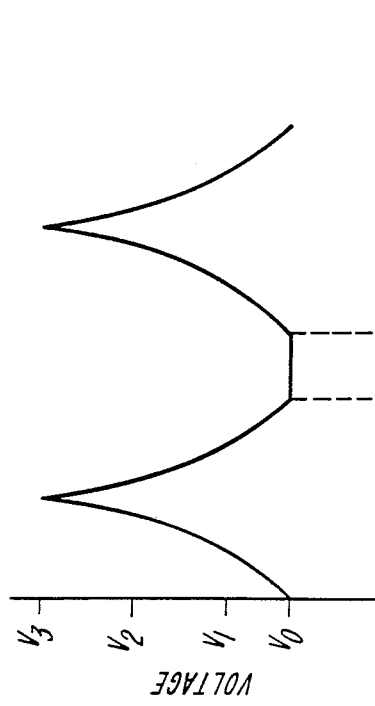
Figure 7D:
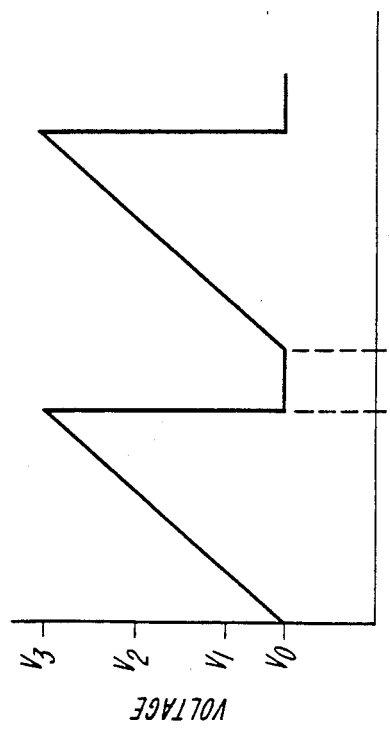
Figure 7F:
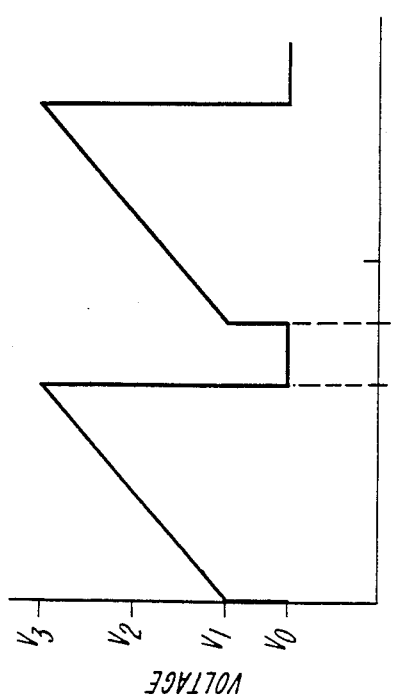

FIGS. 7B through 7F graphically represent alternative waveforms for ion beam scanning by the deflection element 96. FIG. 7B illustrates three back and forth scans with integration occurring after all three scans, and before effecting a compensation operation as described above with reference to FIG. 7A. FIG. 7C shows linear scanning occurring only in one direction across the scan path 98, followed by a rapid, essentially instantaneous, return to the starting voltage ($V_0$) and with integration occurring after each unilateral linear scan. FIG. 7D shows essentially the waveform of FIG. 7C with the addition of a step superimposed to rapidly advance the beam 102 from the off target position, e.g., from trajectory 102a, to the beginning edge of the target surface 100. FIG. 7E shows a waveform that is essentially the inverse of that shown in FIG. 7A and in which beam stop 104 is on the side of the target surface 100 such that the voltage ($V_0$) is the largest scanning voltage applied to the scanning element 96. FIG. 7F shows a nonlinear scanning waveform which can advantageously be used to compensate for other nonlinearities in the ion optical system, such as the voltage/deflection angle characteristic of the electrostatic deflection plates in the deflection element 96.

FIGS. 8A and 8B together diagrammatically show a further advantageous embodiment of the invention for the compensation of total ion dose on a target object by translating the target object a number (N) of times across the beam scan path of the system 90 of FIG. 6. This practice of the invention preferably includes the measurement of the translate position as a function of time during the implantation operation, and the use of a memory element to store the accumulated ion dose (D) at successive translate positions of the target object.

The system 90 as described above can adjust the scanning interval (t) to compensate for small changes in ion beam current. However, when a reduction of beam current (i) is such that the desired duration time (t') of Equation 4 is greater than the repeat time (T), and (T) does not increase correspondingly, the compensation for the beam current decrease may be incomplete. Yet a dose control system as illustrated in FIG. 6 in accord with the invention can provide the appropriate compensation. FIG. 8A shows the target surface 100 aligned above a graphical representation in FIG. 8B of ion dose as a function of position y transverse to the beam path 98, i.e., in the direction of the translation axis 114 in FIG. 6. The dose produced each time the target surface 100 is in a position $y = y_i$, e.g., during each of (N) translate scans of the target object, is measured with the beam detector 106 and is added to the dose accumulated for all previous times the same target object 112 was in the same translate position. This accumulated dose information can be stored, as in a computer memory of the dosage controller 118 (FIG. 6). Dose information can be accumulated and stored in different memory locations corresponding to different values of y, with the step size or y-increment between successive measurements and locations being equal to ($v_0 T_0$).

The next time the translate driver 108 brings the target surface 100 to the same position $y_i$, the fast electrostatic scanning time t is adjusted so that the dose delivered at position $y_i$ is equal to the difference between the required dose at the end of the present translate and the measured accumulated dose (D) at that (y) position, as illustrated in FIG. 8B. In the event this difference is too large to be compensated within the allowed repeat time (T) of the beam scan, the dose control element 118 can continue compensation in the course of the next target translate, i.e., the next time the target object 112 is in the position ($y_i$). At the end of the ($N_0$) translates initially specified for the implant operation, a further translational scan may be performed with t=0 for some target positions, i.e., where no further ion dose is required, and with irradiation occurring only a those translate positions, i.e., along the axis 114, where the total accumulated dose is less than the specified final dose $D_0$. This process both improves dose uniformity and allows the uniformity actually being achieved to be stored and displayed.

FIG. 9 shows a combined block-pictorial representation of the system 90 of FIG. 6 with components of the dose controller 118 according to the invention. The dose controller 118 as illustrated employs a uniformity control computer 120 together with a computer memory 122 and a display terminal or like output element 124. FIG. 9 illustrates the ion source 92 and the deflection element 96 of FIG. 6 as a single scanning ion beam source 92, 96 connected with a separate deflection voltage waveform generator 96a.

The position sensor 116 produces an electrical signal representative of the y position, i.e., the translate position along arrow 114, of the wafer surface 100. This signal is applied to the uniformity control computer and, either directly as indicated, or by way of the computer 120, to the computer memory 122. The illustrated display terminal 124, which is optional in the system, is connected with the computer 120 and with the memory 122 and provides a display of accumulated ion implant dose as a function of translation position (y).

With further reference to FIG. 9, the ion beam detector 106 which typically includes a current integrator, produces a signal responsive to integrated beam current and applies it to the control computer 120. In the illustrated arrangement, the computer 120 also receives from the deflector generator 96a a signal representative of the scanning duration time t. The control computer 120 produces an accumulated dosage signal, i.e., corresponding to D=kit. The computer memory 122 can store this signal for each translate position, and the display unit 124 as noted can display it as a function of translate position.

The uniformity control computer 120 also produces an adjusted duration signal (t') in accordance with Equation 6 and applies it to the deflector generator 96a for altering the scan rate as described above, particularly with reference to FIG. 7A, to reduce the difference between the actual implant dose and the desired dose at that time in the implant operation. In this manner, the system of FIG. 9 performs dose control operations and processes as described above, particularly in connection with FIG. 7A and FIGS. 8A and 8B.

With further reference to FIG. 9, the illustrated dose controller 118 also includes a traveling beam detector 124, as described above with reference to detector 82 in FIG. 4, coupled with a drive and position sensing unit 126 that moves the traveling detector along the beam path 98 at a rate that is slow relative to the scan on the ion beam. The drive and sense unit 126 maintains the traveling detector 124 positioned out of the path 98 and removed from the target transport 110 when the target transport is positioned to move a target object across the scanning path 98. The illustrated drive and position unit 126 moves the traveling detector 124 along the scan path only when the target transport 110 is entirely clear of the scan path, for example, when the target transport is moved to a loading or transport station for the removal of a completed workpiece or for loading a fresh workpiece.

Note that the system of FIG. 9 can employ a single ion beam detector both for the traveling detector 126 as well as for the end of scan detector 106. However, for clarity, FIG. 9 illustrates a system employing two beam detectors. The traveling detector 124, which typically is a Faraday type detector, detects a signal (i) responsive to the time integral of a number of current pulses, each produced when a scanning beam 102 sweeps across the detector 124 as it slowly moves across the target path 98. The drive and position unit 126, in addition to controlling the movement of the traveling detector 124, develops a signal (x) which identifies the position of the detector 124 along the scan path 98 as a function of time. This position signal thus identifies the location of the traveling detector 124 at essentially each instant, as it slowly moves along the scan path and the signal thus identifies where along the path the detector is measuring beam current, at any given time.

The deflector voltage waveform generator 96a receives the current signal (i) from the detector 124 and receives the position signal (x) from the drive and position sensing unit 126. In response to these signals, and typically in conjunction with the uniformity control computer 124, the waveform generator 96a produces a deflection voltage waveform, in response to which the scanning ion beam source 92, 96 scans the ion beam. The deflection generator computes the waveform to produce a beam scan that delivers a uniform level of ion current to each point on the target surface, or another selected spatial distribution of current along the scan path 98, on each fast scan of the ion beam across the path. This computer deflection waveform can be represented by the equation $$dV/dt = dV/dt_0 * I_x/I_0 \qquad \text{(Eq. 8)}$$

where $I_0$ is the desired ideal beam current, $I_x$ is the beam current at the point (x) as measured with the traveling detector 124 when the gradient of the deflection waveform is $dV/dt_0$, and $dV/d$ is the computed gradient for the waveform required to correct for the difference between $I_x$ and $I_0$.

In summary, the dose uniformity control system of the invention as illustrated in FIG. 9 can adjust and modify the deflection waveform to control the ion beam scan to attain a uniform or other selected beam current on the target path at each point along the fast scan. The system further can adjust the duration and correspondingly the rate of each fast scan, with adjustment of the duration time (t) to introduce a selected ion dose to a target object with each scan and further selected in accordance with the position of the beam scan on the target object, i.e., along the coordinate direction which is transverse to the ion beam scan direction. The system, moreover, can adjust the relative time (T) when each beam scan commences in correspondence with the transverse scan, i.e., translation, of the target object relative to the scan path. The system can also control the rate of transverse scan, i.e., of translation, and can select the number of times a target object is transversely scanned, i.e., translated past the scan path 98. In this manner the system provides a selected accumulated ion dose at each selected transverse, i.e., translational, position on the target object. To attain these results, the dose controller 118 of FIG. 6 includes, as described with reference to FIG. 9, a programmable digital computer together with a computer memory and a display terminal. The system also includes devices for sensing the ion beam current, as provided by the illustrated Faraday detectors 106 and 124, together with drive and position sensing elements as illustrated by the drive and position sensor 126 and the position sensor 116, and further includes a deflection waveform generator 96a which operates in conjunction with the scanning ion beam source.

Figure 10:
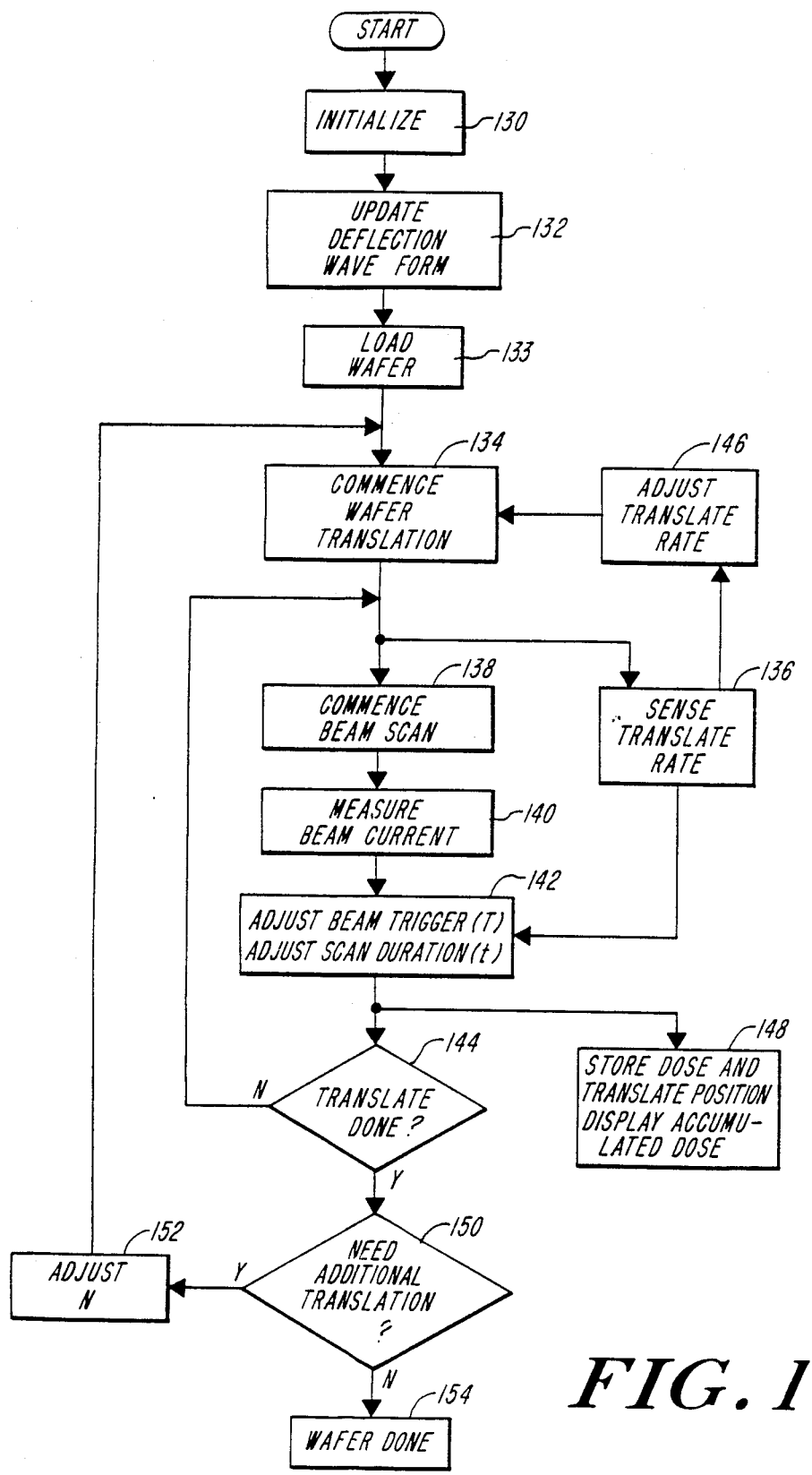
FIG. 10 is a flow chart illustrating ion beam implantation according to one practice of features of the invention.

The flow chart of FIG. 10 illustrates an operating sequence for ion beam implantation of a semiconductor wafer during integrated circuit manufacture in accordance with the invention with, for example, the system 90 of FIG. 9. The illustrated sequence, which those skilled in the art can implement with varying details for specific implementations, commences with an initialize operation 130. Parameters which typically are set during this operation include the desired total process dose for the semiconductor wafer, the number of wafer translates across the scan path, the nominal values of the trigger time ($T_0$) and of the scan duration (t), and the desired dose per scan for each location on the wafer along the axis transverse to the direction of beam scan. The sequence then updates the deflection waveform, i.e., the waveform which the generator 96a applies to the scanning ion beam sources 92, 96, with operation 132. This update operation typically includes multiple fast scans of the ion beam across the target path 98, with the target transport 110 out of the way and the traveling ion detector 124 slowly moving along the beam path 98 for measuring the ion beam current at least at selected locations along the beam path and preferably essentially continually along the beam path, together with sensing of the traveling detector position, with the drive and position sensor 126. The illustrated operating sequence then advances to operation 133, in which a wafer is loaded onto the target transport 110. In operation 134, the sequence commences translating the wafer in the direction transverse to the beam scan with the translator drive 108. During the wafer translation across the scanning beam path, the illustrated sequence includes the steps of scanning the ion beam across the path 98, per operation 138, concurrently with sensing the translate position with the position sensor 116, per operation 136.

The illustrated sequence commences beam scan, with operation 138, at least by the time the first region of the wafer to be irradiated begins to translate past the beam path 98. During each scan, or alternatively once for a selected set of several beam scans, the beam current is measured, operation 140, as implemented with the Faraday detector 106 of FIG. 9. In response to the resultant measures of beam current and translate position, as indicated with operation 142, the sequence can adjust the beam trigger time (T) and adjust the beam scan duration time (t).

At the end of each scan, the sequence determines whether the translation of the wafer across the beam path 98 is complete, as indicated with decision operation 144. A negative determination returns the sequence to perform another beam scan, i.e. to repeat operations 138, 140, and 142 while continuing the wafer translation and the position sensing of operations 134 and 136. The illustrated sequence hence repeatedly scans the ion beam across the target object, with adjustment of the scan duration and scan initiation times once every set of one or more consecutive beam scans.

The illustrated sequence concurrently can perform a further dose controlling operation, as indicated with operation 146, and adjust the translation rate, at least in part in response to the sensing of translate position with operation 136. The illustrated sequence also includes an operation 148 during which the dose and translate position information for each scan are stored and the accumulated dose is displayed, as described above with reference to FIGS. 8A and 8B.

In response to an affirmative decision from operation 144, i.e. the determination that the entire wafer surface has been irradiated, the illustrated sequence executes a further decision operation 150 and determines whether the accumulated dose at all points on the wafer surfaces is at the desired level, i.e. determines whether an additional scan translation is required. An affirmative decision causes the sequence to adjust the number (N) of translational scans, operation 152, and returns the sequence to commence another wafer translation, i.e. to operation 134. A negative decision from operation 150 advances the sequence to operation 154, at which point the ion implantation process is completed and the wafer can be unloaded from the transport.

A feature of the invention, particularly advantageous in the manufacture, for example, of integrated circuits by ion implantation of a semiconductor wafer, is a method and apparatus for sensing the ion beam incident at the station where the semiconductor wafer is exposed to the beam, and for controlling the exposure to the beam, and for controlling the exposure to attain a selected ion dosage at each location on the target object, with the specific object of obtaining highly uniform dosage over the entire target surface.

By way of background to this dose control aspect of the invention, the prior art includes three types of ion implanters. One employs an ion beam which is swept in two dimensions across a stationary semiconductor wafer or other target being irradiated with the ion beam. A second employs an ion beam which remains stationary and in which the wafer or other target is moved in two dimensions, either rectangularly (x, y) or polarly (r, 0). The third type employs a hybrid system in which the wafer is moved along one coordinate direction while the ion beam is moved along the other direction. In each of these types, one scan speed is sufficiently faster than the other so that a non overlying pattern of quasi-parallel lines is laid down on the wafer, i.e., a pattern in which each trace of the beam on the target is offset from another.

The first type of implanter is embodied in a typical medium current instrument. One wafer at a time is implanted by electrostatically scanning the ion beam by two orthogonal pairs of sweep plates or other beam deflectors. The (x) and (y) scan frequencies are usually random, or if stabilized, are arranged so that the ion beam pattern is not routinely repeated, e.g. a Lissajous figure is not formed. The position of the ion beam at any time during the ion implantation operation is largely unknown.

The second type of implanter is embodied in a typically high current instrument employing an apertured spinning scanning disk. Roberts U.S. Pat. No. 3,778,626 describes how uniformity is obtained with this apparatus by varying the radial velocity of the disk to compensate for the geometrical change in angular velocity, which is proportional to (1/R), where (R) is the distance between the disk axis and the beam intercept. Ryding U.S. Pat. No. 3,234,727 discloses positioning a precision scanning slot radially in the scanning disk, to avoid measuring (R). In other prior mechanisms, the scanning slot is required to be in the slow scan direction. By using one or more scanning slots to act as a pseudo-wafer, beam pulses measured in a Faraday cup mounted behind the disk are used to continuously adjust the radial velocity through the slot at all values of (R). Again, beam position at any time is largely unknown.

Examples of the third type of implanter utilize an ion beam scanned electrostatically in one direction and impinging on target wafers mounted on the inside or outside of a spinning drum. Alternatively, a slow changing magnetic field scans the beam radially across an apertured spinning disk.

In contrast to these prior techniques, apparatus and procedures are provided for monitoring or otherwise determining the position of the beam on the wafer or other target continuously, or at least at plural selected times during the ion implantation, and for maintaining essentially an inventory of beam intensity as a function of position during the course of the implant. The apparatus and techniques further can make immediate correction of ion dose being implanted on the wafer or other target. Should the range of dose correction be insufficient to correct fully for variations during the normal course of an implant, in accordance with the invention, an extra implant pass is activated to in effect "fill in the holes", i.e., to correct the remaining dose deficiency. The method and apparatus according to the invention moreover make it possible for a wafer to be removed from the implant equipment, and to be subsequently repositioned in the instrument to complete, adjust or correct the implantation of the complete wafer or of a particular portion of it.

The dose uniformity control features of this invention can be applied to each of the three general types of ion implanters noted above, in accordance with the following teaching. A preferred embodiment described herein pertains specifically to a hybrid scan system, i.e., to the third type noted above.

According to one aspect of the dosage control feature of the invention, the method and apparatus employ a source of an ion beam, a target surface which can include a single semiconductor wafer or a plurality of wafers or another target object, and an element for producing relative motion of the ion beam across the target surface along two coordinate directions. The relative motion in one direction is at a first rate which is significantly faster than the second rate, in the other direction. This practice of the invention also employs an element for sensing the ion beam current at periodic or otherwise selected intervals, an element for sensing the position of the ion beam relative to the target surface at the time of current sensing, and an element responsive to the sensed beam current, and position, for controlling the first rate and/or the second rate and/or the position of the ion beam relative to the target surface, so as to reduce any deviation of the dose of ions being implanted from a predetermined desired value, over the full target surface.

A preferred embodiment for the dosage control features of the invention are described in conjunction with a hybrid type ion beam scanning system in which fast parallel scanning of an ion beam is achieved with a fast one-dimensional electrostatic scanner and which operates in conjunction with a linear mechanical scan or transport of the target object. However, those skilled in the art will appreciate that many aspects of the invention can be incorporated advantageously with other types of implanters and beam scanning devices.

One specific practice according to the dose control feature of the invention includes sensing the ion beam current at least at multiple locations along the target path which the scanning beam traverses. An electrical signal responsive to the sensed beam current at each location is applied to the beam scanning element to attain a selected ion beam current at each location along the target path. This practice of the invention thus provides an electrical signal responsive to beam current and as a function of position along the path of the beam scan, and applies that signal to control the beam scanning movement as a function of time, as the beam traverses the scanning path, to attain a selected beam current at each point or location along the path. Typically, the desired distribution is a highly uniform current, and this practice of the invention attains that result with high accuracy and precision.

A preferred implementation of this practice involves scanning the ion beam at a relatively fast rate and sensing the beam current along the scan path during many scans. The beam sensing can be attained with a sensing element which traverses the scan path at a slow rate relative to the scanning rate, at a time when no target object is in place.

Another specific practice according to the dose control feature of the invention includes a method and apparatus for moving the semiconductor wafer or other target object transversely relative to the ion beam scan path, so that successive beam scans cross at different adjacent locations on the target object. The ion beam is sensed at selected intervals during the traverse across the entire target object, typically as frequently as once per scan across the target object. The position of the target object relative to the beam scanning path at each such sensing is noted. This beam measurement and position information are applied to control successive sets of one or more scans to ensure that the successive scans are in exact accord with the desired dosage for that location on the target object.

Yet another practice provides a method and apparatus for monitoring the transverse movement of the target object relative to the beam scanning path and initiating a set of one or more beam scans only when the target object is advanced by a selected increment.

The dose control feature of the invention thus provides an apparatus and method for sensing the ion beam to which a target object is exposed, both along the beam scan and at successive scans together with monitoring of the beam position along both scan coordinates. The invention thus provides for the monitoring of the ion beam essentially at all points of exposure on the target object, and the monitoring of the beam position on the target object at each point of measurement, and the use of this information to control the beam movement along each scan coordinate for attaining a selected spatial distribution of implant dose on the target object. The practice of this invention can, moreover, include scanning an ion beam across a target object a multiple number of times to attain a selected dose distribution, and adjusting the number of scan sequences to attain this end with further precision.

The practice of the foregoing features of the invention provide ion beam scanning apparatus that is unusually compact and has low power consumption for a given final beam energy. Moreover, the scanning equipment is suited for relatively competitive manufacture. Further, the scanning equipment attains highly precise and accurate dosage on a scanned object. The practice of the invention in semiconductor manufacture thus provides multiple benefits including enhanced throughput and a significant reduction in manufacturing failures.

Other embodiments of the invention can be applied to each of the generic ion implanter types described above. In those versions where the slow scan, rather than the fast scan, is available for control and manipulation, the response time will be similarly slower so that the applied techniques, although effective, will be less immediate in their response.

For electrostatically scanned beams of the first type, a linear Faraday cup or linear array of Faraday cups can be mounted alongside the wafer; one preferred embodiment is to align the Faraday cup or cups perpendicular to the fast scan direction. Additionally, in order to know the spatial relationship between the wafer and the ion beam at all times, the slow scan is preferably rastered step-wise across the wafer. In this arrangement, techniques substantially identical to those described above, particularly with reference to FIGS. 6–9, can be used to monitor and control dose uniformity.

For mechanically scanned implanters of the second type, linear or rotary, position encoders can be incorporated in both the fast scan and the slow scan mechanisms to provide signals representative of the location of the ion beam on any particular wafer at any time during the implant. The slow scan rate and/or beam current intensity can be continuously adjusted in response to the current measurement, as described herein above. In the case of a spinning disc, current can be measured through a single slot in the disc, through slots between the wafers, or by mounting the wafers on spokes in the disc with spaces between. By employing a fast beam gate (preferably electrostatic) or a beam current pulser, a dose anomaly which is noted but cannot be corrected fully during the course of an implant, can be subsequently corrected. This can be achieved in further accord with this invention by making one or two additional transits in which knowledge of the location of the beam on each wafer and use of the fast beam gate are combined to implant only the desired regions on specified wafers.

For hybrid type implanters of the third type employing drums or belts, a fixed Faraday cup can be mounted to one side of the drum or belt, to enable control of the electrostatic or magnetic beam scan in combination with a rotary or linear position encoding device on the mechanical motion.

For beams scanned electrostatically or magnetically over a disk, a slot or slots in the disk can be used to control the electrostatic or magnetic scan waveform, while a rotary encoding device on the disk and a fast beam gate can be used for anomaly connection, as already described herein.

The invention thus described provides improvements in a sector magnet for ion beam deflection to attain in particular trajectories in a scanned beam which have a selected direction and which preferably are parallel with one another. The invention further provides anion beam accelerator which employs electrodes having a slotted aperture for the passage of the ion beam and provides a new overall ion optics geometry for a scanning ion beam instrument. The new geometry combines beam deflection in an analyzer in the same direction as further beam deflection for scanning, coupled with an opposite direction of beam deflection to attain parallel or otherwise selectively directed trajectories in the scanning beam.

Further features of the invention provide ion beam dose control for a high level of dose uniformity. The dose uniformity or other selected profile can be attained along each single scan of the beam across a target object and, separately, in successive sets of one or more scans to attain a specified dose profile at each point along a complete set of coordinates over the target surface. The dose control feature includes essentially a mapping of ion beam level at each point on the target object surface and hence includes a measurement and recording of target position throughout ion implant operation.

In one practice of the invention for ion beam implantation of semiconductor wafers in integrated circuit manufacture, a semiconductor wafer with a diameter in the order of 200 mm is subjected to an ion beam with an energy of, for example, 200 kilovolts and a beam current as large as in the order of 2 milliamperes. The practice attains a dose uniformity well below one percent deviation, and typically is well below one-half percent deviation across the entire surface of the wafer. The system scans the beam across a beam path at an illustrative rate of 1000 Hertz, traverses the target in the transverse direction of arrow 114 at a rate of approximately 1 Hz, and moves a moving ion detector, such as detector 124 in FIG. 9, across the beam path in a time in the order of 5 seconds. Further in this illustrative example, the ion beam has a width along the transverse direction of arrow 114 of approximately one quarter inch and the target object translation in this direction in the time of one beam scan is 1/100 of an inch. Thus the ion beam width in this illustrative embodiment is twenty five times the distance between successive beam traces as the target object translates.

According to a further aspect of the invention, methods and apparatus are provided for increasing ion beam utilization efficiency in an ion implanter. In the scanning techniques described hereinabove, the ion beam is scanned between beam stop 104 and Faraday detector 106 in the X direction. In the Y direction, the translate driver 108 translates target wafer 112 from a point completely below the ion beam 102 to a point completely above the ion beam. The direction of translation is then reversed and the target wafer 112 is translated to a position completely below the ion beam. The Y translation dimension is increased to provide sufficient time for the mechanical translate driver 108 to reach full speed before the target wafer 112 begins to intercept the ion beam 102. Thus, the target wafer 112 intercepts the ion beam 102 during only a portion of the scanning cycle. An ion beam utilization efficiency can be defined as the area of the workpiece or target wafer 112, typically a semiconductor wafer, divided by the effective area over which the beam is scanned. In the above described apparatus the effective scanning area is approximately given by the electrostatic scanning width in the horizontal or X direction multiplied by the amplitude of the mechanical motion in the vertical or Y direction. Methods and apparatus will now be described for reducing the effective area of scanning by reducing the dimensions of the unused scan in both the horizontal and vertical directions, thereby improving beam utilization efficiency.

A schematic representation of target wafer 112 and the slot of Faraday detector 106 is shown in FIG. 11. The slot of Faraday detector 106 is spaced from target wafer 112 in the X direction by an amount on the order of one-half to one inch due to mechanical constraints, including a clamping ring (not shown) for clamping target wafer 112 in its implant position and the mechanical structure of Faraday detector 106. In order to accurately monitor the ion beam current during implantation, it is necessary to scan the ion beam 102 over Faraday detector 106. In the above-described scanning technique, the ion beam 102 is scanned over Faraday detector 106 once each scan in the X direction, as indicated by dashed waveform 202 in FIG. 11.

In accordance with the present invention, it has been found that dose accuracy can be maintained and ion beam utilization efficiency can be increased by scanning the ion beam 102 over Faraday detector 106 less frequently than once per normal scanning cycle. In accordance with a preferred technique for scanning, as shown in FIG. 11, the X direction scan includes a fast scan signal 204 which scans the ion beam across the target wafer 112 and the Faraday detector 106, and a slow scan signal 206 which scans the ion beam only across target wafer 112. The scan time for slow scan signal 206 is a known multiple of the scan time for fast scan signal 204. The slow scan signal 206 can be repeated one or more times. Then, fast scan signal 204 is repeated in order to measure the ion beam current. Thus, a larger fraction of a complete scan is spent with the ion beam 102 incident on the target wafer 112. Even though the ion beam current is measured by Faraday detector 106 less frequently, high dose accuracy is maintained. The fast scan is an uncompressed, or normal, scan, and the slow scan is compressed in width.

It is necessary, even with the compressed slow scan 206 to scan the ion beam 102 beyond the edges of the target wafer 112 by a predetermined fraction of the ion beam width in order to avoid dose variations near the edges of the target wafer 112. Preferably, the ion beam 102 is scanned beyond the edges-of target wafer 112 by approximately one-half the ion beam diameter.

The ion beam current measured by Faraday detector 106 is less than the ion beam current applied to target wafer 112, since the ion beam current is measured only during the uncompressed scans. The ion beam current delivered to the target wafer 112 and to the Faraday detector 106 is shown by waveform 210 in FIG. 11. Since the ratio between the fast scan time and the slow scan time is known, the total ion dose delivered to target wafer 112 can be calculated from the current measured during each fast scan.

An alternate technique for improving ion beam utilization efficiency is illustrated schematically in FIG. 12. In this embodiment, a first scan signal 214 scans the ion beam across the target wafer 112 and the Faraday detector 106. Then, multiple second scan signals 216 scan the ion beam across target wafer 112 and any required overscan. In this embodiment, the scan rates of first scan signal 214 and second scan signal 216 are the same, and the second scan signal 216 is repeated a predetermined number of times, typically five or more.

Yet another technique for increasing beam utilization efficiency is illustrated schematically in FIG. 12A. A scan signal 220 includes a slow scan portion 222 when the ion beam 102 is incident on target wafer 112. When the ion beam 102 reaches the edge of target wafer 112, the scan rate is increased to provide a rapid scan portion 224 in which the ion beam is scanned over Faraday detector 106. On the return scan, a slow scan portion 226 is utilized when the ion beam is incident on target wafer 112. Thus, the ion beam 102 spends more time over target wafer 112 and less time scanning over Faraday detector 106 in proportion to the scanning rates. Thus, the beam utilization efficiency is increased.

In each of the above high efficiency scanning techniques, it will be understood that the ion beam 102 is scanned beyond the edges of target wafer 112 by a predetermined distance on the order of one half of the beam diameter in order to insure dose accuracy near the edges of target wafer 112. The ratio between the fast scan and slow scan speeds and/or the ratio between the number of uncompressed scans and the number of compressed scans is selected to balance the dose accuracy and the ion beam utilization efficiency. As indicated above, ratios of five or greater are preferred.

The scan waveforms illustrated in FIGS. 11, 12 and 12A are typically generated by a conventional integrator having a digital to analog converter connected to its input. The DAC supplies appropriate voltages to the integrator to control scan speed and direction. Both the compressed and uncompressed scan signals utilize a rest period between scans, as shown in FIG. 7A, between time, t, and time T. The rest period is required for dose uniformity control during implantation of the wafer 112.

Figure 13:
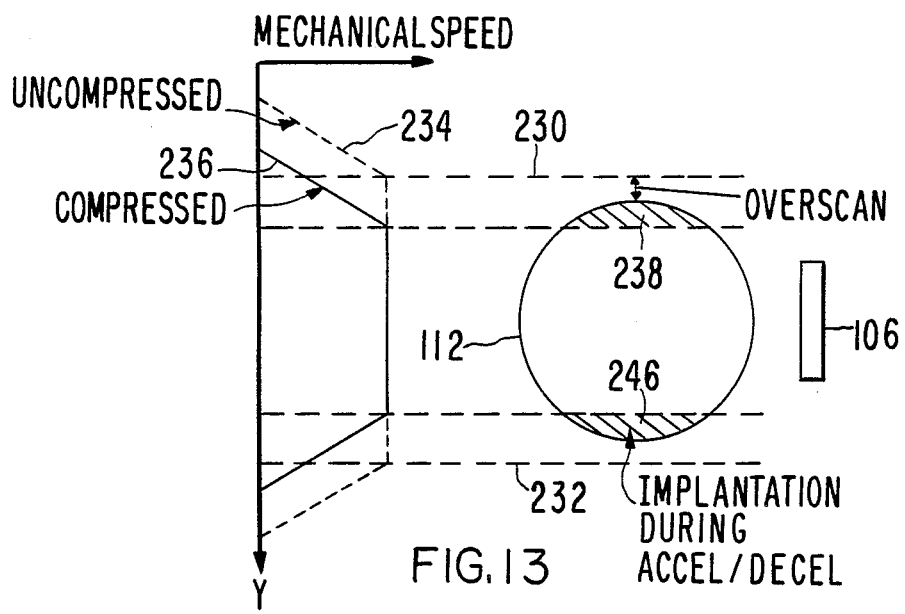
FIG. 13 is a schematic diagram illustrating compression of a mechanical scan to improve beam utilization efficiency.

The vertical, or Y direction, mechanical scan described above insures that the target wafer 112 is mechanically overscanned above and below the ion beam 102. The mechanical overscan is illustrated in FIG. 13 by dashed lines 230 and 232. The purpose of the overscan is to ensure a constant mechanical speed while the ion beam 102 is scanning target wafer 112. A motor used to implement the translate driver 108 requires an appreciable time to decelerate, stop and then accelerate in the reverse direction. The uncompressed mechanical scan is illustrated by dashed line 234 in FIG. 12. The mechanical scan amplitude is sufficiently large to insure that the ion beam 102 is not applied to the target wafer 112 during acceleration and deceleration. It can be seen that the portions of the mechanical scan in which the beam is not applied to the wafer result in reduced ion beam utilization efficiency.

According to a further feature of the present invention, the mechanical scan is reduced in amplitude as indicated by line 236 in FIG. 13. With the reduced amplitude mechanical scan, the target wafer 112 is being accelerated or decelerated during a portion of the time that the ion beam 102 is being scanned over the target wafer 112. In the prior technique wherein X direction scans are triggered at predetermined time intervals, dose errors would occur in the crosshatched regions 238 and 240 at the top and bottom of the wafer with a reduced amplitude mechanical scan, since the wafer is not moving at a constant speed when these portions of the wafer are being scanned.

Figure 14:
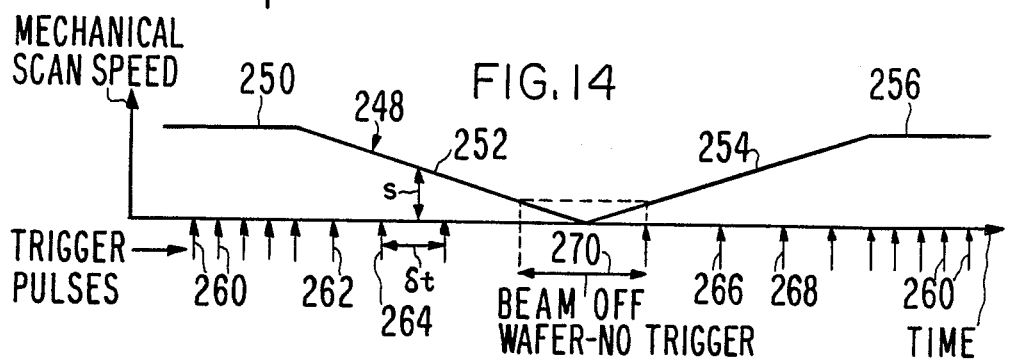
FIG. 14 is a graphic representation of scan triggering during mechanical acceleration and deceleration.
Figure 15:
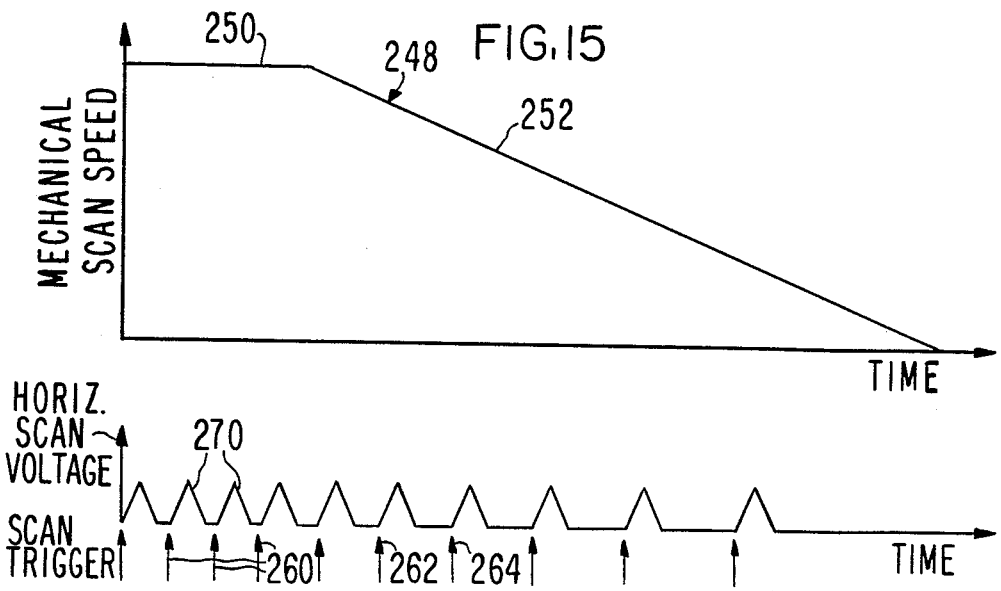
FIG. 15 is a graphic representation of waveforms during mechanical deceleration.

According to the present invention, dose variations in regions 238 and 240 are prevented, as shown in FIGS. 14 and 15, by triggering the horizontal beam scan only after the wafer 112 has moved in the Y direction by a predetermined constant distance. In FIG. 14, the mechanical scan speed near the end of a scan is illustrated generally at 248. The target wafer 112 is decelerated during portion 252 from constant speed during scan portion 250 to zero. The target wafer 112 is then accelerated during scan portion 254 in the reverse direction to constant speed during scan portion 256. During portions 250 and 256 when the target wafer is being moved at a constant speed, the horizontal scan is triggered at constant intervals by trigger pulses 260. For a 1 kilohertz uncompressed scan, the trigger pulses 260 occur at 1 millisecond intervals. When a compressed scan utilizing a slow scan 206 as shown in FIG. 11 is utilized, the trigger pulses 260 occur at intervals of 5 milliseconds or more.

When the mechanical speed of the vertical motion of the target wafer 112 is varying due to acceleration or deceleration near the ends of the scan, the time between X direction scan trigger pulses is increased so that trigger pulses 262, 264, 266 and 268 occur only after the wafer 112 has moved a predetermined constant distance p=s x dt, where s is the instantaneous speed and dt is the time between trigger pulses. The distance p is the scan pitch, or the distance between adjacent scan lines on the target wafer 112. By adjusting the time dt between trigger pulses 262, 264 etc., the distance p is maintained constant independent of the mechanical speed of the wafer 112 in the vertical direction. During a time 270, when the mechanical speed of the translate driver 108 is near zero, the beam 102 is off the wafer 112, and no trigger pulses are generated.

The vertical position of the target wafer 112 is determined by measuring the position of the translate driver 108 by means of position sensor 116 (FIG. 9). The trigger pulses 260, 262, 264, etc. are generated each time the position of the target wafer 112 is incremented by the distance p. Thus, the scan lines are evenly spaced over the target wafer 112, including regions 238 and 240 where the mechanical scan speed is varying, thereby ensuring a constant dose over the entire surface of the wafer.

The mechanical scan speed 248, including constant velocity portion 25C and deceleration portion 252 is illustrated in FIG. 15, along with trigger pulses 260, 262 and 264. The corresponding horizontal scan waveforms 270 are illustrated. It can be seen that the scan waveforms 270 are triggered less frequently as the mechanical scan speed decreases. The compressed scan waveforms in the horizontal direction have been omitted from FIG. 15 for simplicity. However, it will be understood that when horizontal scan compression is utilized, the scan waveforms 270 are modified as illustrated in one of FIGS. 11, 12 and 12A.

Techniques for increasing ion beam utilization efficiency in horizontal and vertical directions, have been described hereinabove. It will be understood that these techniques can be utilized either separately or in combination.

Figure 16:
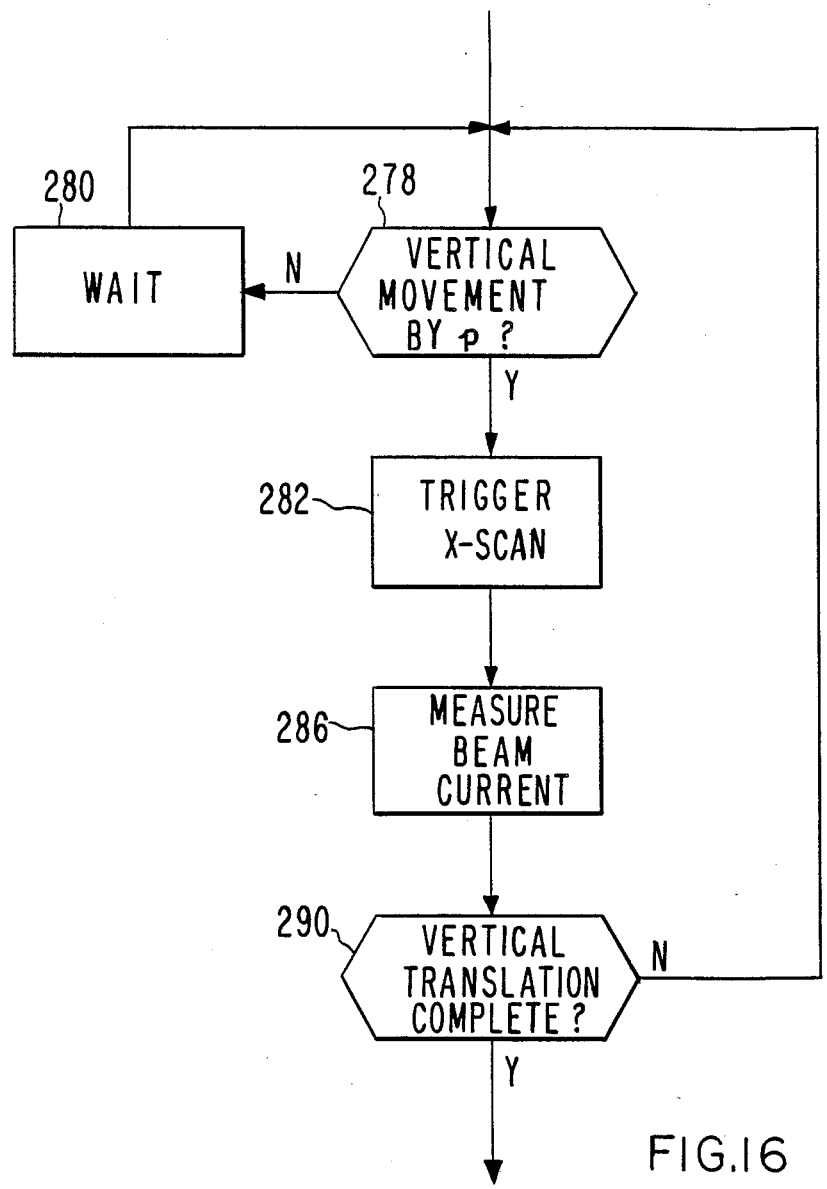
FIG. 16 is a flow chart illustrating high efficiency scanning of a workpiece.

A flow diagram illustrating combined use of the techniques for increased beam utilization efficiency is illustrated in FIG. 16 in which one complete scan of target wafer 112 is illustrated. It will be understood that the scan technique illustrated in FIG. 16 is incorporated into the general flow diagram illustrated in FIG. 10 for a complete implantation cycle including multiple scans and dose compensation. The movement in the vertical direction is checked in step 278 to determine if the target wafer 112 has been moved by a distance p. Until the wafer 112 is traversed a distance p, the procedure simply waits 280 until the distance p has been traversed. Then the required horizontal scan is triggered in step 282. When a fast scan and a slow scan are used in an alternating manner as shown in FIG. 11 and described hereinabove, the trigger at step 282 causes a fast scan followed immediately by a slow scan. When multiple compressed scans are utilized as shown in FIG. 12, each trigger produces a complete sequence of uncompressed and compressed scans. The beam current is measured by Faraday detector 106 in step 286 during the uncompressed part of the scan waveform. If the vertical translation is complete, as determined in step 290, one scan of target wafer 112 has been completed. If the scan is not completed, the procedure returns to step 276 and selects an uncompressed or compressed horizontal scan for the next scan line, and the procedure is repeated.

The techniques described above for increasing beam utilization efficiency have been described in connection with an ion implanter which utilizes electrostatic scanning in the horizontal direction and mechanical scanning in the vertical direction. It will be understood that these techniques can be utilized in other types of ion implanter. The principal requirements are to compress the horizontal scan to the approximate width of the wafer and to measure the ion beam less frequently than once per normal scanning cycle. In the vertical direction, the principal requirement is to trigger horizontal scans based on movement of the target wafer by a predetermined distance rather than after predetermined intervals. By monitoring the position of the wafer, dose variations caused by mechanical speed variations are eliminated.

It will thus be seen that this invention efficiently attains the objects set forth above, among those made apparent from the preceding description. Since certain changes may be made in carrying out the above process and in the constructions set forth without departing from the scope of the invention, all matter contained in the above description or shown in the accompanying drawings is to be interpreted as illustrative and not in a limiting sense.

It is also to be understood that the following claims are intended to cover all generic and specific features of the invention as described herein, and all statements of the scope of the invention which as a matter of language might be said to fall therebetween. Having described the invention, what is claimed as new and secured by Letters Patent is:

What is claimed is:

1. Ion implantation apparatus comprising:
   means for generating an ion beam;
   first scanning means for scanning said ion beam across a workpiece in a first direction in response to a scan signal;
   second scanning means for scanning said ion beam in a second direction relative to said workpiece so that said ion beam is distributed by said first and second scanning means over said workpiece;
   detection means located adjacent to said workpiece for detecting said ion beam and providing a signal representative of the intensity of said ion beam; and
   means for generating said scan signal including a first scan signal which scans said ion beam across said workpiece and said detection means during a first scan interval and a second scan signal which scans said ion beam across an area not substantially greater in dimension than the maximum dimension of said workpiece along said first direction, said second scan signal being generated during a second scan interval.

2. Ion implantation apparatus as defined in claim 1 wherein said second scan signal has a slower scan rate than said first scan signal.

3. Ion implantation apparatus as defined in claim 1 wherein said second scan signal has a scan rate that is about the same as the scan rate of said first scan signal.

4. Ion implantation apparatus as defined in claim 1 wherein said second scan interval is longer than said first scan interval.

5. Ion implantation apparatus as defined in claim 4 wherein said second scan interval is at least five times as long as said first scan interval.

6. Ion implantation apparatus as defined in claim 1 wherein said means for generating said scan signal includes means for generating a single fast scan across said workpiece and said detection means during said first scan interval and a single slow scan across said workpiece during said second scan interval.

7. Ion implantation apparatus as defined in claim 1 wherein said means for generating said scan signal includes means for generating a single scan across said workpiece and said detection means during said first scan interval and a predetermined number of scans across said workpiece during said second scan interval.

8. Ion implantation apparatus as defined in claim 1 wherein said second scan signal causes said ion beam to overscan said workpiece by a predetermined fraction of the cross-sectional dimension of said ion beam.

9. Ion implantation apparatus as defined in claim 1 wherein said second scanning means includes means for translating said workpiece in said second direction and further including means for providing a position signal representative of the position of said workpiece as it is translated along said second direction and means responsive to said position signal for generating said scan signal each time said workpiece is translated in said second direction by a predetermined distance.

10. Ion implantation apparatus as defined claim 1 wherein said means for generating said scan signal includes means for repetitively and alternately generating said first scan signal and said second scan signal during a single scan of said workpiece by said second scanning means.

11. Ion implantation apparatus comprising:
means for generating an ion beam;
scanning means for scanning said ion beam across a workpiece in a first direction in response to a scan signal;
means for translating said workpiece in a second direction relative to said ion beam so that said ion beam is distributed over said workpiece;
means for providing a position signal representative of the position of said workpiece as it is translated along said second direction; and
means responsive to said position signal for generating said scan signal each time said workpiece is translated in said second direction by a predetermined distance.

12. Ion implantation apparatus as defined in claim 11 wherein said means for translating said workpiece in a second direction includes mechanical means for reciprocating movement of said workpiece in said second direction, said mechanical means providing acceleration and deceleration of said workpiece near the ends of said reciprocating movement, said means for generating said scan signal providing uniform distribution of said ion beam over said workpiece during acceleration and deceleration thereof.

13. Ion implantation apparatus as defined in claim 11 wherein said means for generating said scan signal includes means for triggering said scan signal when said workpiece is translated by said predetermined distance.

14. A method for ion implantation of a workpiece, comprising the steps of:
generating an ion beam;
scanning the ion beam across a workpiece in a first direction in response to a scan signal;
scanning the workpiece in a second direction relative to the ion beam so that the ion beam is distributed over the workpiece;
detecting the ion beam and providing a signal representative of the intensity of the ion beam, said step of detecting the ion beam being performed by a detection means located adjacent to said workpiece; and
generating said scan signal including a first scan signal which scans said ion beam across said workpiece and said detection means during a first scan interval and a second scan signal which scans said ion beam across an area not substantially greater in dimension than the maximum dimension of said workpiece along said first direction, said second scan signal being generated during a second scan interval.

15. A method for ion implantation of a workpiece, comprising the steps of:
generating an ion beam;
scanning said ion beam across a workpiece in a first direction in response to a scan signal;
translating said workpiece in a second direction relative to said ion beam so that said ion beam is distributed over said workpiece;
providing a position signal representative of the position of the workpiece as it is translated along said second direction; and
generating said scan signal in response to said position signal each time said workpiece is translated in said second direction by a predetermined distance.

16. Ion implantation apparatus comprising:
means for generating an ion beam;
first scanning means for scanning said ion beam relative to a workpiece in a first direction;
second scanning means for scanning said ion beam relative to said workpiece in a second direction so that said ion beam is distributed over said workpiece by said first and second scanning means; and
detection means located adjacent to said workpiece for detecting said ion beam and providing a signal representative of the intensity of said ion beam;
said first scanning means including means for scanning said ion beam across said workpiece and said detection means during a first scan interval and means for scanning said ion beam across an area not substantially greater in dimension than the maximum dimension of said workpiece along said first direction during a second scan interval.

17. Ion implantation apparatus comprising:
means for generating an ion beam;
first scanning means for scanning said ion beam relative to said workpiece in a first direction;
second scanning means for scanning said ion beam relative to said workpiece in a second direction so that said ion beam is distributed over said workpiece by said first and second scanning means;
means for monitoring the position of said workpiece relative to said ion beam along said second direction; and
means responsive to said monitoring means for generating one or more scans in said first direction each time said workpiece moves relative to said ion beam in said second direction by a predetermined distance.

18. Ion implantation apparatus comprising:
means for generating an ion beam;
first scanning means for scanning said ion beam relative to a workpiece in a first direction;
second scanning means for scanning said ion beam relative to said workpiece in a second direction so that said ion beam is distributed over said workpiece by said first and second scanning means; and
detection means located adjacent to said workpiece for detecting said ion beam and providing a signal representative of the intensity of said ion beam;
said first scanning means including means for scanning said ion beam over said workpiece at a first rate and for scanning said ion beam across said detection means at a second rate, said second rate being greater than said first rate.

* * * * *